(12) United States Patent
Wariishi

(10) Patent No.: US 9,482,956 B2
(45) Date of Patent: Nov. 1, 2016

(54) PROCESSING LIQUID AND PROCESSING METHOD FOR LITHOGRAPHIC PRINTING PLATE PRECURSOR

(71) Applicant: FUJIFILM Corporation, Minato-ku, Tokyo (JP)

(72) Inventor: Koji Wariishi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/952,399

(22) Filed: Nov. 25, 2015

(65) Prior Publication Data

US 2016/0085157 A1    Mar. 24, 2016

Related U.S. Application Data

(63) Continuation of application No. PCT/JP2014/062264, filed on May 7, 2014.

(30) Foreign Application Priority Data

May 31, 2013  (JP) ................. 2013-115469

(51) Int. Cl.
| | | |
|---|---|---|
| G03F 7/00 | (2006.01) | |
| G03F 7/32 | (2006.01) | |
| G03F 7/027 | (2006.01) | |

(52) U.S. Cl.
CPC ............... *G03F 7/322* (2013.01); *G03F 7/027* (2013.01)

(58) Field of Classification Search
CPC .................................................. B41C 2210/04
See application file for complete search history.

(56) References Cited

U.S. PATENT DOCUMENTS

2010/0316956 A1    12/2010  Memetea et al.

FOREIGN PATENT DOCUMENTS

| JP | 1-170941 A | 7/1989 |
|---|---|---|
| JP | 2004-233610 A | 8/2004 |
| JP | 2007-230185 A | 9/2007 |
| JP | 2012-529668 A | 11/2012 |

OTHER PUBLICATIONS

International Search Report dated Aug. 12, 2014 issued in International Application No. PCT/JP2014/062264 (PCT/ISA/210) English Translation.
Written Opinion dated Aug. 12, 2014 issued in International Application No. PCT/JP2014/062264 (PCT/ISA/237).
Translation of Written Opinion dated Aug. 12, 2014, issued by the International Searching Authority in counterpart International Application No. PCT/JP2014/062264 (PCT/ISA/237).

*Primary Examiner* — Chanceity Robinson
(74) *Attorney, Agent, or Firm* — Sughrue Mion, PLLC

(57) ABSTRACT

Disclosed are a processing liquid and a processing method that can favorably perform plate inspection of an on-press development-type lithographic printing plate precursor and image quality control, by using a processing liquid of a lithographic printing plate precursor having an image recording layer formable of an image by removing an unexposed region with at least one of printing ink and dampening water, the processing liquid containing a basic coloring dye expressed by General Formula (I) below and an anionic surfactant having an aromatic ring:

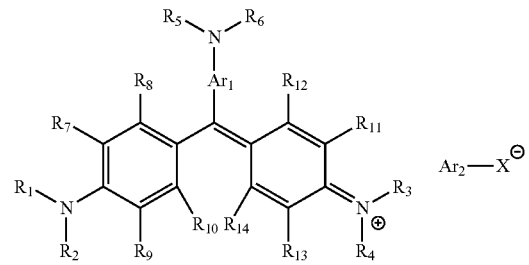

General Formula (I)

wherein each of $R_1$ to $R_{14}$ independently represents a hydrogen atom and an alkyl group having 1 to 4 carbon atoms, $R_{10}$ and $R_{14}$ may be bonded to each other to form a single bond, $Ar_1$ represents a phenylene group or a naphthylene group, $Ar_2$ represents an aryl group, and $X^-$ represents $SO_3^-$ or $COO^-$.

9 Claims, No Drawings

PROCESSING LIQUID AND PROCESSING METHOD FOR LITHOGRAPHIC PRINTING PLATE PRECURSOR

CROSS REFERENCE TO RELATED APPLICATION

This is a continuation of International Application No. PCT/JP2014/062264 filed on May 7, 2014, and claims priority from Japanese Patent Application No. 2013-115469 filed on May 31, 2013, the entire disclosures of which are incorporated herein by reference.

BACKGROUND OF THE INVENTION

1. Field of the Invention

The present invention relates to a processing liquid and a processing method for a lithographic printing plate precursor. The invention particularly relates to a processing liquid and a processing method for a lithographic printing plate precursor having an image recording layer that can be removed with at least one of printing ink and dampening water.

2. Description of the Related Art

In a plate manufacturing step of a lithographic printing plate precursor, there is suggested a method called an on-press development that obtains a lithographic printing plate by performing image-exposure by using an image recording layer in which an unnecessary portion of a lithographic printing plate precursor can be removed in a general printing step and removing a non-image portion from a printing press. According to this method, it is possible to obtain a lithographic printing plate by electronically processing image information using a computer, accumulating the image information, causing a highly astringent radiation ray such as a laser beam to carry the digitalized image information according to outputting digitalizing techniques, performing image-exposure due to scanning exposure of the lithographic printing plate precursor, and removing a non-image portion using at least one of printing ink and dampening water from a printing press. Therefore, it is possible to omit a development processing step of a lithographic printing plate, which is a necessary step in the printing field in the related art. Accordingly, a plate manufacturing operation can be performed in a completely dry circumstance (in which liquid is not used), such that operational and environmental burdens can be greatly reduced.

The plate manufacturing by the on-press development has advantages as described above, but the nature of having a step of removing an image recording layer by using a printing press, in view of preventing coloring contaminations of ink and dampening water, only a minimum amount of colorant can be used in the image recording layer, and this may cause a problem. Generally, as a step performed before a printing plate is installed on a printing press, a plate inspection operation of inspecting and identifying an image on a printing plate, such as whether the image is recorded on the printing plate as desired and what color of ink for the plate is, is performed. In the general lithographic printing plate precursor accompanied by the development processing step using a developing liquid, it is easy to check an image after the development process and before the printing (before the printing plate is installed in the printing press), by adding a colorant in the image recording layer. However, in the case of an on-press development-type lithographic printing plate precursor that is not accompanied by the development processing step before printing, the image recording layer contains only a small amount of colorant, and thus, in a step in which the lithographic printing plate precursor is installed in the printing press after the exposure, it is difficult to check an image and it is not possible to identify a printing plate. Therefore, this causes an erroneous operation.

In addition, in the field of printing, an operation of checking whether appropriate exposure and development have been performed by using a halftone dot area measuring machine or a concentration meter in the related art has been generally performed. The operation is called a calibration operation, and is an important operation that is continuously performed in order to properly maintain image quality all the time. There are plural kinds of methods of checking the image quality, but a method of outputting an image in a predetermined halftone dot area ratio with an exposure machine, performing a development process, measuring and digitizing obtained halftone dots by using a halftone dot area measuring machine or a concentration meter, and changing an exposure signal if a numerical value is deviated such that the numerical value comes close to a desired numerical value is generally employed. Here, the concentration meter used herein has detection sensitivity in a general visible range (400 nm to 700 nm). Therefore, in the case of the on-press development-type lithographic printing plate which has little absorption in this wavelength range as described above, an image is not sufficiently detected and thus a calibration operation may not be sufficiently performed. In addition, the halftone dot area measuring machine obtains halftone dots as an image with a device such as a CCD, performs image-processing with the obtained image, divides the image into a non-image portion and an image portion using a certain threshold value, and digitizes an area ratio of the image portion. Therefore, if a contrast between the non-image portion and the image portion is low, the image is not sufficiently detected, and thus the calibration operation may not be sufficiently performed.

Further, recently, requests for a high-definition printed matter has been increasing, and according to these requests, a high definition image is frequently formed by exposing the image with a high-definition AM screen or an FM screen. However, the high-definition image is formed with an aggregation of finer dots (halftone dots), and thus, due to poor development or ununiform development of an unexposed region, and unevenness of screen tint or in-plane non-uniformity of halftone dot sizes on a printing plate that have not been not generated when an AM screen in the related art is used is generated such that halftone dot reproducibility decreases. In order to deal with these problems, it is required to more accurately identify an image portion and a non-image portion in plate inspection or image quality control.

As a method of plate inspection or image quality control in an on-press development-type lithographic printing plate precursor, JP2007-230185A discloses a processing liquid including a basic coloring dye and an anionic surfactant and a method of processing an on-press development-type lithographic printing plate precursor by using the processing liquid. In addition, JP2012-529668A discloses a method of manufacturing a lithographic printing plate including a step of coating a coloring liquid including a water-insoluble colorant and a specific solvent.

However, according to the techniques disclosed in the patent documents described above, plate inspection or image quality control of an on-press development-type lithographic printing plate precursor may not be sufficiently performed. Particularly, if a high definition image is formed by performing exposure using a high definition AM screen or a high definition FM screen, it is not substantially possible to perform plate inspection or image quality control.

SUMMARY OF THE INVENTION

An object of the invention is to provide a processing liquid and a processing method in which plate inspection or image quality control of an on-press development-type lithographic printing plate precursor can be favorably performed.

Another object is to provide a processing liquid and a processing method in which plate inspection or image quality control of a high definition image in an on-press development-type lithographic printing plate precursor can be easily performed.

The objects of the invention can be achieved by a processing liquid and a processing method for a lithographic printing plate precursor described below.

(1) A processing liquid for a lithographic printing plate precursor having an image recording layer formable of an image by removing an unexposed region with at least one of printing ink and dampening water, the processing liquid including a basic coloring dye expressed by General Formula (I) below and an anionic surfactant having an aromatic ring.

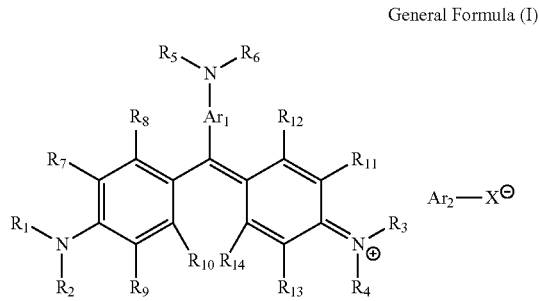

General Formula (I)

In General Formula (I), each of $R_1$ to $R_{14}$ independently represents a hydrogen atom and an alkyl group having 1 to 4 carbon atoms, $R_{10}$ and $R_{14}$ may be bonded to each other to form a single bond, $Ar_1$ represents a phenylene group or a naphthylene group, $Ar_2$ represents an aryl group, and $X^-$ represents $SO_3^-$ or $COO^-$.

(2) The processing liquid for a lithographic printing plate precursor according to (1), in which the aryl group represented by $Ar_2$ in General Formula (I) is a phenyl group or a naphthyl group.

(3) The processing liquid for a lithographic printing plate precursor according to (1) or (2), in which $X^-$ in General Formula (I) above is $SO_3^-$.

(4) The processing liquid for a lithographic printing plate precursor according to any one of (1) to (3), in which the anionic surfactant having the aromatic ring is an anionic surfactant having a naphthalene skeleton or a diphenyl ether skeleton.

(5) The processing liquid for a lithographic printing plate precursor according to any one of (1) to (4), in which the content of a basic coloring dye expressed by General Formula (I) above is 0.001% by mass to 5% by mass.

(6) The processing liquid for a lithographic printing plate precursor according to any one of (1) to (5), in which a content of the anionic surfactant having the aromatic ring is 0.1% by mass to 20% by mass.

(7) A processing method for a lithographic printing plate precursor including processing an image-exposed lithographic printing plate precursor by using the processing liquid for a lithographic printing plate precursor according to any one of (1) to (6).

(8) The processing method for a lithographic printing plate precursor according to (7), in which the image recording layer of the lithographic printing plate precursor contains an infrared absorber, a polymerization initiator, a polymerizable compound, and a binder polymer.

(9) The processing method for a lithographic printing plate precursor according to (8), in which the binder polymer is a binder polymer having a polyoxyalkylene structure in a side chain.

According to the invention, it is possible to obtain a processing liquid and a processing method in which plate inspection or image quality control of an on-press development-type lithographic printing plate precursor can be favorably performed. In addition, it is possible to obtain a processing liquid and a processing method in which plate inspection or image quality control of a high definition image in an on-press development-type lithographic printing plate precursor can be easily performed.

DESCRIPTION OF THE PREFERRED EMBODIMENTS

Hereinafter, the invention is described in detail. In this specification, "(meth)acrylate" means "at least one of acrylate and methacrylate", and, in the same manner, a "(meth) acryloyl group", a "(meth)acrylic acid", and a "(meth) acrylic resin" respectively mean at least one of an acryloyl group and a methacryloyl group, at least one of an acrylic acid and a methacrylic acid, and at least one of an acrylic resin and a methacrylic resin.

[Processing Liquid of Lithographic Printing Plate Precursor]

A processing liquid for a lithographic printing plate precursor having an image recording layer that can form an image by removing an unexposed region with at least one of printing ink and dampening water according to the invention contains a basic coloring dye expressed by General Formula (I) and an anionic surfactant having an aromatic ring.

<Basic Coloring Dye Expressed by General Formula (I)>

The basic coloring dye used in the processing liquid according to the invention is a triarylmethane-based coloring matter expressed by General Formula (I).

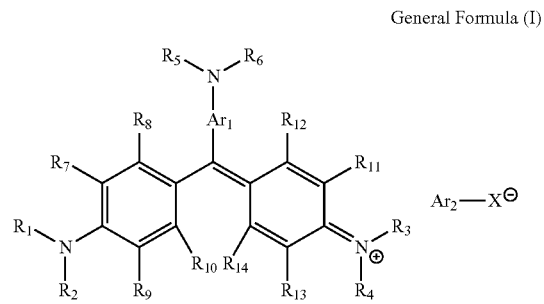

General Formula (I)

In General Formula (I), each of $R_1$ to $R_{14}$ independently represents a hydrogen atom or an alkyl group having 1 to 4 carbon atoms. In addition, $R_{10}$ and $R_{14}$ may be bonded to each other to form a single bond. $Ar_1$ represents a phenylene group or a naphthylene group. Ar$_2$ represents an aryl group. X$^-$ represents SO$_3^-$ or COO$^-$.

Alkyl groups having 1 to 4 carbon atoms which are expressed by R$_1$ to R$_{14}$ are straight chain or branched alkyl groups, and may have substituents. The number of carbon atoms of the alkyl group is preferably 1 to 3 and particularly 1 or 2.

Examples of the substituent of the alkyl group include a halogen atom, an aryl group, a heterocyclic group, a cyano group, a hydroxyl group, a nitro group, an alkoxy group, an aryloxy group, a silyloxy group, a heterocyclic oxy group, an acyloxy group, a carbamoyloxy group, an alkoxycarbonyloxy group, an aryloxycarbonyloxy group, an acylamino group, an aminocarbonylamino group, an alkoxycarbonylamino group, an aryloxycarbonyl group, a mercapto group, an alkylthio group, an arylthio group, a heterocyclic thio group, a sulfo group, an alkyl- and arylsulfinyl group, an alkyl- and arylsulfonyl group, an acyl group, an aryloxycarbonyl group, an alkoxycarbonyl group, a carbamoyl group, a phosphino group, a phosphinyl group, a phosphinyloxy group, a phosphinylamino group, and a silyl group. If the alkyl group has two substituents, the substituents may be identical to or different from each other. Preferable substituents are a cyano group, a halogen atom, an alkoxy group, and a hydroxyl group.

Specific examples of the alkyl group are methyl, ethyl, n-propyl, isopropyl, n-butyl, sec-butyl, t-butyl, and benzyl.

The phenylene group or the naphthylene group expressed by An may have a substituent. Examples of the substituent of the phenylene group or the naphthylene group include an alkyl group, and a halogen atom. The number of carbon atoms of the alkyl group is preferably 1 to 6 and more preferably 1 to 4. The alkyl group may have a substituent, and examples of the substituents include a hydroxy group, a cyano group, an alkoxy group, a fluorine atom, a sulfo group, and a carboxy group. As the halogen atom, a chlorine atom and a bromine atom are preferable and a chlorine atom is more preferable.

The phenylene group or the naphthylene group expressed by Ar$_1$ is preferably an unsubstituted phenylene group or an unsubstituted naphthylene group.

The number of carbon atoms of the aryl group expressed by Ar$_2$ is preferably 6 to 20 and more preferably 6 to 10. Examples of the aryl group include a phenyl group, a naphthyl group, and an anthranil group, and a phenyl group or a naphthyl group is preferable. The aryl group may have a substituent. Examples of the substituent of the aryl group may be an alkyl group and the groups exemplified as the substituent of the alkyl group. If the aryl group has two or more substituents, the substituents may be identical to or different from each other. Preferable substituents are an alkyl group, an acyl group, an alkoxy group, and a hydroxyl group.

As X$^-$, SO$_3^-$ is preferable.

The basic coloring dye having a structure expressed by General Formula (I) has characteristics of having solubility in a proper processing liquid, exhibiting favorable permeability to a photosensitive layer by being combined with an anionic surfactant having an aromatic ring described below, and providing a high pigment concentration in an image portion.

In view of solubility to a processing liquid and a favorable pigment concentration, the addition amount of the basic coloring dye expressed by General Formula (I) to a processing liquid is preferably 0.001% by mass to 5% by mass and more preferably 0.01% by mass to 2% by mass.

Specific examples of a coloring matter mother nucleus in the basic coloring dye expressed by General Formula (I) are presented below, but the invention is not limited thereto.

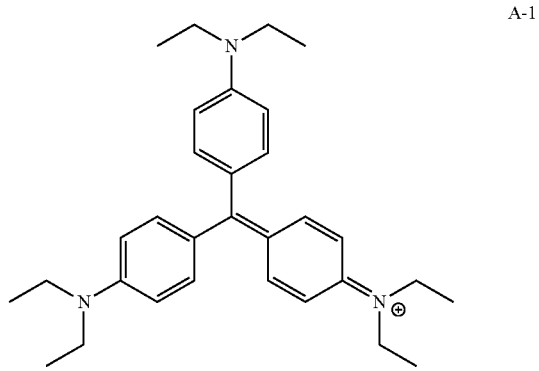

A-1

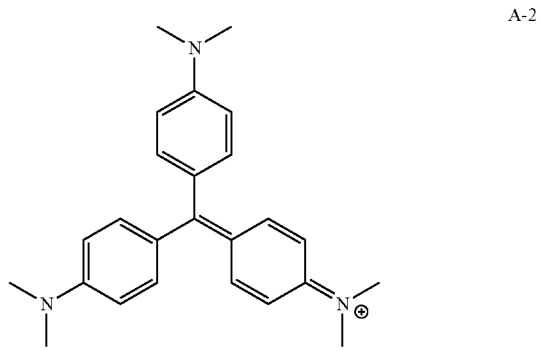

A-2

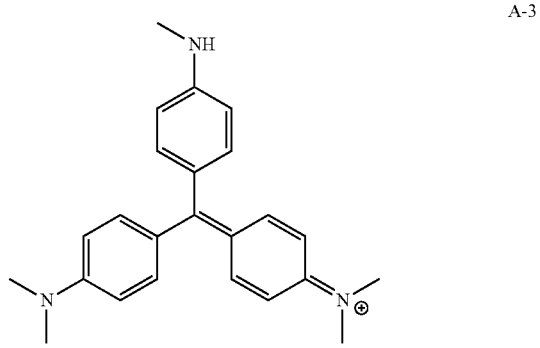

A-3

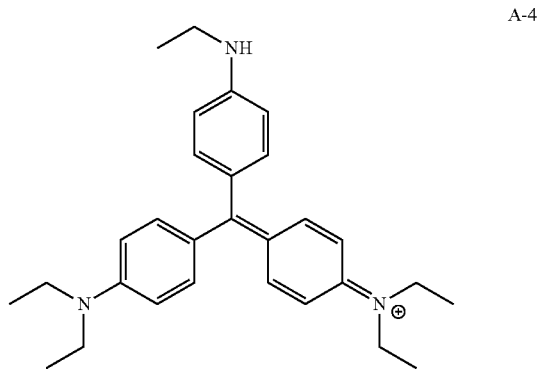

A-4

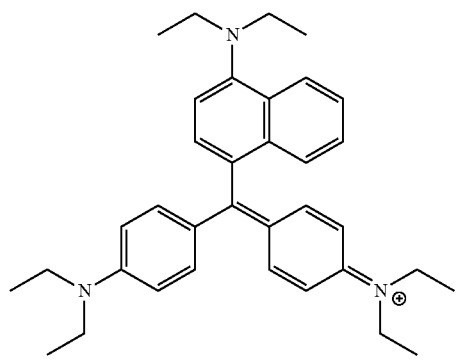

A-5

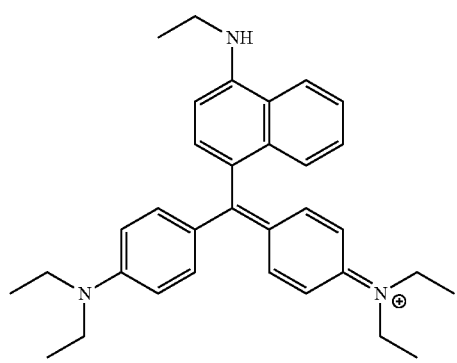

A-6

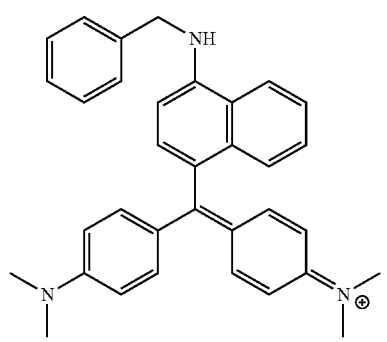

A-7

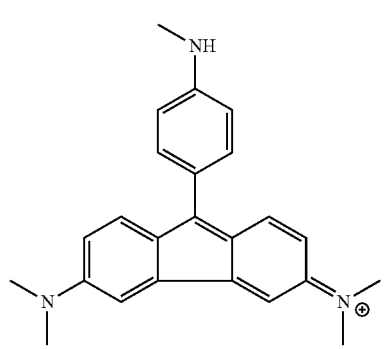

A-8

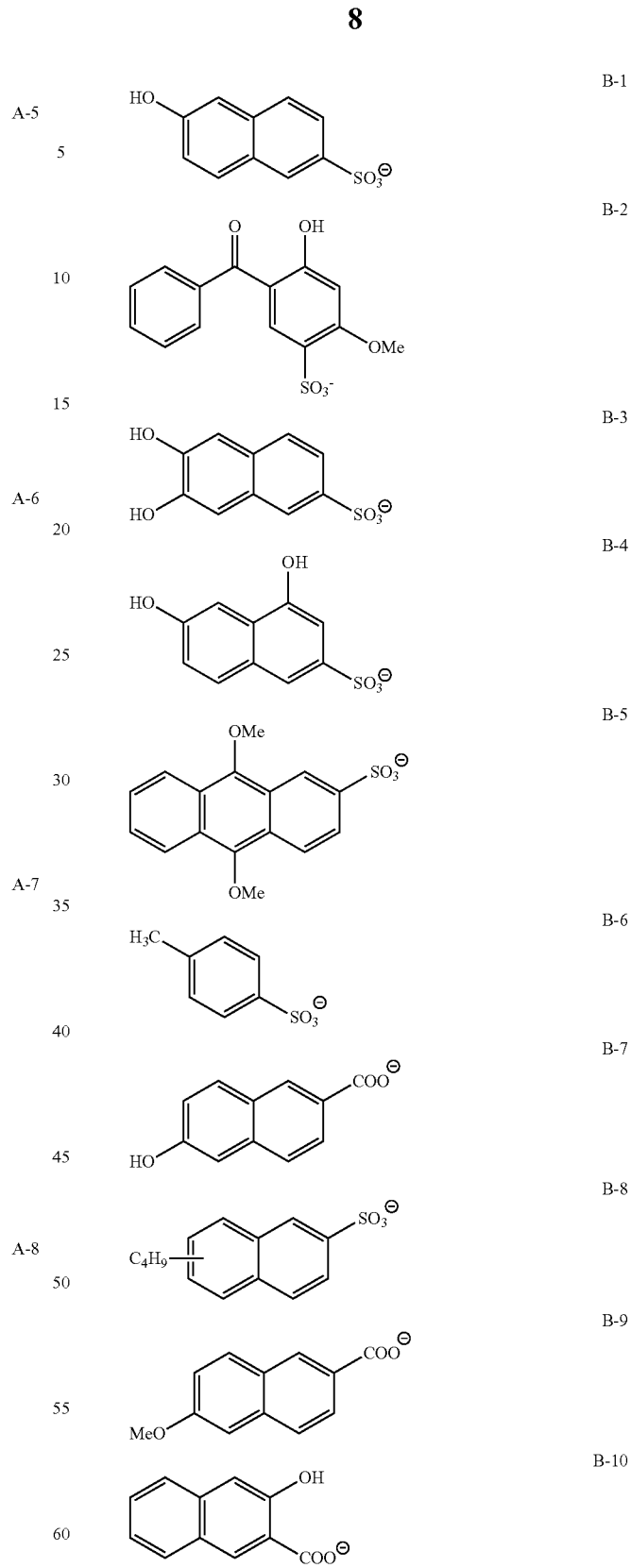

Specific examples of counter anions in the basic coloring dye expressed by General Formula (I) are presented below, but the invention is not limited thereto.

Specific examples of the basic coloring dye expressed by General Formula (I) are presented in Table 1 by dividing the basic coloring dye into coloring matter mother nucleuses and counter anions, but the invention is not limited thereto.

TABLE 1

| Basic coloring dye | Coloring matter mother nucleus | Counter anion |
|---|---|---|
| D-1 | A-1 | B-1 |
| D-2 | A-1 | B-2 |
| D-3 | A-1 | B-4 |
| D-4 | A-1 | B-7 |
| D-5 | A-2 | B-1 |
| D-6 | A-2 | B-9 |
| D-7 | A-2 | B-10 |
| D-8 | A-3 | B-1 |
| D-9 | A-3 | B-5 |
| D-10 | A-3 | B-8 |
| D-11 | A-4 | B-1 |
| D-12 | A-5 | B-1 |
| D-13 | A-6 | B-1 |
| D-14 | A-6 | B-2 |
| D-15 | A-6 | B-4 |
| D-16 | A-7 | B-3 |
| D-17 | A-8 | B-1 |
| D-18 | A-8 | B-6 |

<Anionic Surfactant Having Aromatic Ring>

The anionic surfactant used in the processing liquid according to the invention is an anionic surfactant having an aromatic ring in a molecular structure thereof. The aromatic ring may be any one of a hydrocarbon-based aromatic ring such as a benzene ring and a naphthalene ring and a heterocyclic aromatic ring such as a furan ring, a pyridine ring, a pyrimidine ring, and a benzothiazole ring, but a hydrocarbon-based aromatic ring is preferable.

Examples of the anionic surfactant having the aromatic ring include alkyl diphenyl ether disulfonic acid salts, alkyl diphenyl ether monosulfonic acid salts, dialkyl diphenyl ether disulfonic acid salts, straight chain alkyl benzene sulfonic acid salts, branched chain alkyl benzene sulfonic acid salts, alkyl naphthalene sulfonic acid salts, alkyl phenoxy polyoxyethylene propyl sulfonic acid salts, polyoxyethylene alkyl phenyl ether sulfuric acid ester salts, polyoxyethylene styryl phenyl ether sulfuric acid ester salts, polyoxyethylene alkyl phenyl ether phosphoric acid ester salts, partially saponified products of a styrene-maleic anhydride copolymer, and naphthalene sulfonate formalin condensates.

As the anionic surfactant having an aromatic ring, an anionic surfactant having a naphthalene skeleton or a diphenyl ether skeleton is preferable. For example, alkyl naphthalene sulfonic acid salts, alkyl diphenyl ether disulfonic acid salts, alkyl diphenyl ether monosulfonic acid salts, and alkyl diphenyl ether disulfonic acid salts are preferably used.

A preferred example of the anionic surfactant having an aromatic ring includes a surfactant expressed by General Formula (II).

$$Ar-Y-X \qquad (II)$$

In Formula (II), Ar represents an aryl group. Y represents a single bond or a bivalent linking group that links Ar and X. X represents an acid group or a salt thereof.

The aryl group expressed by Ar has preferably 6 to 30 carbon atoms, and more preferably 6 to 10 carbon atoms. Specific examples of the aryl group include a phenyl group, a naphthyl group, an indenyl group, and an anthranyl group. As the aryl group, a phenyl group or a naphthyl group is preferable and a naphthyl group is particularly preferable.

The aryl group may have a substituent. Examples of the substituent that the aryl group may have include a halogen atom (for example, a chlorine atom, a bromine atom, and an iodine atom) and a univalent non-metallic atomic group. Examples of the univalent non-metallic atomic group include an alkyl group (preferably a substituted or unsubstituted straight-chain, branched, and cyclic alkyl group having 1 to 30 carbon atoms and more preferably an alkyl group having 4 to 20 carbon atoms, and specifically, methyl, ethyl, n-propyl, isopropyl, t-butyl, n-octyl, eicosyl, 2-chloroethyl, 2-cyanoethyl, 2-ethyl hexyl, cyclohexyl, cyclopentyl, 4-n-dodecyl cyclohexyl), an aryl group (preferably a substituted or unsubstituted aryl group having 6 to 30 carbon atoms, specifically, phenyl, p-tolyl, naphthyl, m-chlorophenyl, o-hexadecanoylaminophenyl, and the like), a hydroxyl group, and a carboxyl group, and salts thereof, an alkoxy group (preferably, a substituted or unsubstituted alkoxy group having 1 to 30 carbon atoms, and specifically, methoxy, ethoxy, isopropoxy, t-butoxy, n-octyloxy, and 2-methoxyethoxy), an aryloxy group (preferably, a substituted or unsubstituted aryloxy group having 6 to 30 carbon atoms, specifically, phenoxy, 2-methylphenoxy, 4-t-butyl phenoxy, 3-nitrophenoxy, and 2-tetradecanoyl aminophenoxy), an acyloxy group (preferably a formyloxy group, a substituted or unsubstituted alkylcarbonyloxy group having 2 to 30 carbon atoms, and a substituted or unsubstituted arylcarbonyloxy group having 6 to 30 carbon atoms, and specifically, formyloxy, acetyloxy, pivaloyloxy, stearoyloxy, benzoyloxy, and p-methoxyphenylcarbonyloxy), a sulfo group or salts thereof, an aryloxycarbonyl group (preferably substituted or unsubstituted aryloxycarbonyl group having 7 to 30 carbon atoms, and specifically, phenoxycarbonyl, o-chlorophenoxycarbonyl, m-nitrophenoxycarbonyl, and p-t-butyl-phenoxycarbonyl), an alkoxycarbonyl group (preferably, a substituted or unsubstituted alkoxycarbonyl group having 2 to 30 carbon atoms, and specifically, methoxycarbonyl, ethoxycarbonyl, t-butoxycarbonyl, and n-octadecyloxycarbonyl), and a polyoxyalkylene group expressed by —$(OC_nH_{2n})_m$—OR (here, $C_nH_{2n}$ represents a straight-chain or branched alkylene group. n represents an integer of 2 or greater, and an integer of 2 to 4 is preferable. R represents a hydrogen atom or an alkyl group, and a hydrogen atom is preferable. m represents an integer of 2 or greater, an integer of 2 to 30 is preferable, and an integer of 2 to 20 is more preferable. Specifically, a group such as —$(OCH_2CH_2)_m$—OH, and —$(OCH_2CH(CH_3))_m$—OH, and the like are exemplified).

In the substituent, from a substituent having a hydrogen atom, the hydrogen atom may be removed and further substituted with a substituent described above.

As the substituent that the aryl group may have, an alkyl group, an alkoxy group, an aryloxy group, an hydroxy group, a sulfo group, or salts thereof, and a polyoxyalkylene group are preferable.

Examples of the bivalent linking group that links Ar and X expressed by Y include an alkylene group, a polyoxyalkylene group, an oxygen atom, an arylene group or a carbonyl group, or a group formed by combining two or more of these groups. If Y is a single bond, Ar and X are directly bonded.

The alkylene group expressed by Y is preferably an alkylene group having 18 or less carbon atoms, and an alkylene group having 6 or less carbon atoms is more preferable. Specific examples thereof include a methylene group, an ethylene group, a propylene group, and a butylene group.

Examples of the polyoxyalkylene group expressed by Y include a group expressed by —$(OC_nH_{2n})_m$—. Here, n represents an integer of 2 to 4, m represents an integer of 2 or greater, an integer of 2 to 30 is preferable, and an integer of 2 to 20 is more preferable. Specifically, —(OCH$_2$CH$_2$)$_m$— and —(OCH$_2$CH(CH$_3$))$_m$— are preferable, and —(OCH$_2$CH$_2$)$_m$— is more preferable.

The arylene group expressed by Y has preferably 6 to 30 carbon atoms and more preferably 6 to 10 carbon atoms.

Y is preferably a single bond, a polyoxyalkylene group, an oxygen atom, an alkylene group, and a carbonyl group, or a bivalent linking group obtained by combining these groups. Specific examples of the bivalent linking group obtained by combining these groups include —(OCH$_2$CH$_2$)$_s$—O— (s represents an integer of 1 to 30), —(OCH$_2$CH$_2$)$_s$—O—(CH$_2$)$_t$— (s represents an integer of 1 to 30 and t represents an integer of 1 to 18), and —(OCH$_2$CH$_2$)$_s$O—C(=O)—(CH$_2$)$_t$— (s represents an integer of 1 to 30 and t represents an integer of 1 to 18).

In the bivalent linking group, from a bivalent linking group having a hydrogen atom, the hydrogen atom may be removed and further substituted with a substituent described as the substituents that Ar may have.

The acid group expressed by X and salts thereof is preferably —SO$_3$H, —COOH, or —PO$_3$H$_2$ or salts thereof. —SO$_3$H or —PO$_3$H$_2$ or salts thereof is more preferable, and —SO$_3$H or salts thereof is particularly preferable. A cationic group for forming an acid group and salts thereof is not particularly limited. As the cationic group, an inorganic cationic group such as a lithium cation, a sodium cation, and a potassium cation and an organic cationic group such as an ammonium group and a phosphonium group are preferable.

Hereinafter, specific examples of the anionic surfactant having an aromatic ring are provided, but the invention is not limited thereto.

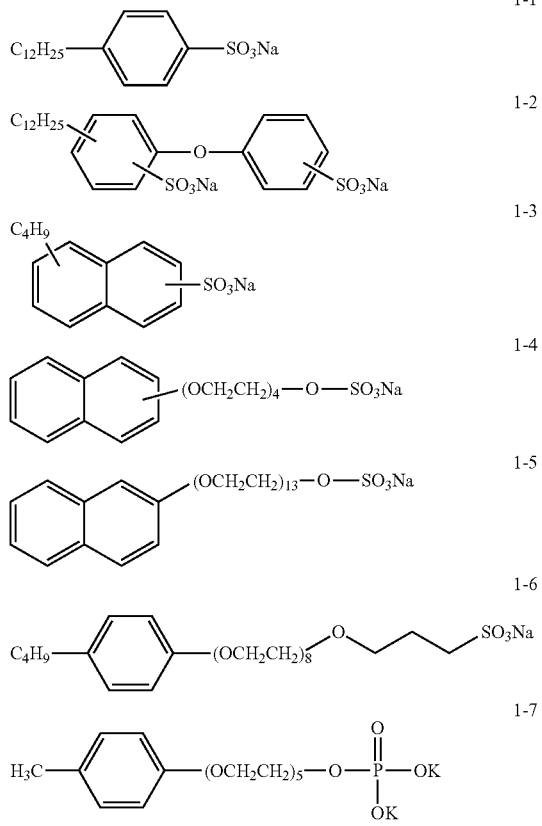

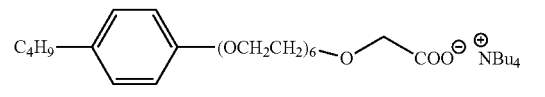

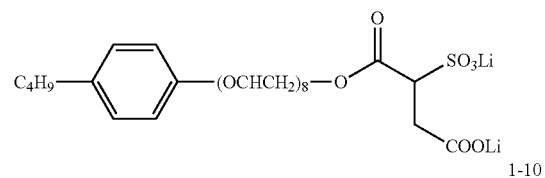

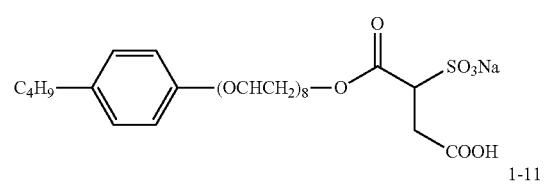

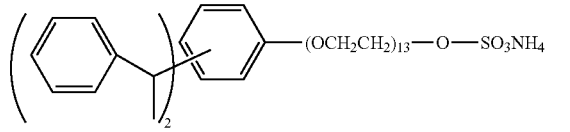

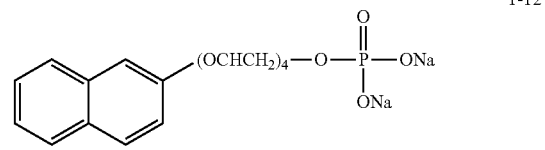

The addition amount of the anionic surfactant having the aromatic ring to the processing liquid is preferably 0.1% by mass to 20% by mass, more preferably 1% by mass to 20% by mass, and particularly preferably 3% by mass to 15% by mass.

If the processing liquid according to the invention contains the basic coloring dye expressed by General Formula (I) and the anionic surfactant having the aromatic ring as described above, it is possible to favorably perform plate inspection of an on-press development-type lithographic printing plate precursor and image quality control. Particularly, it is possible to easily perform plate inspection of a high-definition image or image quality control. In addition, the processing liquid is excellent in dispersibility of the development scum caused by the removed unexposed region, and thus the problem in that the development scum is attached to the surface of the lithographic printing plate after a process does not occur.

<Other Components>

The processing liquid according to the invention includes water as a solvent. Water as a solvent is not particularly limited, and water which is generally used in a processing liquid such as a developing liquid of a lithographic printing plate precursor is suitably used. Examples thereof include tap water, ion-exchanged water, distilled water, and pure water.

Further, the processing liquid contains a pH adjuster such as an organic solvent, a defoaming agent, a preservative, a wetting agent, a chelating agent, a water-soluble polymer, an acid, and an alkali, and a pH buffering agent. The organic solvent is mainly used for increasing permeability of a processing liquid to an image portion of an image recording layer, increasing dyeability, and also promoting removal of an image recording layer in a non-image portion.

As the organic solvent, an organic solvent of which solubility to water at normal temperature (20° C.) is 10% by mass or less is preferable. Most of these organic solvents have characteristics of permeating an unexposed region (non-image portion) of an image recording layer. Examples of the organic solvent include carboxylic acid esters such as ethyl acetate, propyl acetate, butyl acetate, amine acetate, benzyl acetate, ethylene glycol monobutyl acetate, butyl lactate, and butyl levulinate; ketones such as ethyl butyl ketone, methyl isobutyl ketone, and cyclohexanone; alcohols such as ethylene glycol monobutyl ether, ethylene glycol benzyl ether, ethylene glycol monophenyl ether, benzyl alcohol, methyl phenyl carbinol, n-amyl alcohol, and methyl amyl alcohol; alkyl-substituted aromatic hydrocarbons such as xylene; and halogenated hydrocarbons such as methylene dichloride, ethylene dichloride, and monochlorobenzene. These organic solvents may be used singly or two or more types thereof may be used in combination. Among these organic solvents, ethylene glycol monophenyl ether or benzyl alcohol is particularly effectively used. Generally, a content of the organic solvent in the processing liquid is properly about 0% by mass to 10% by mass and preferably 0.5% by mass to 5% by mass.

Examples of the water-soluble polymer compound include gum arabic, dextrin, and cellulose derivatives (for example, carboxymethyl cellulose, carboxyethyl cellulose, and methyl cellulose), and modified products thereof, pullulan and polyvinyl alcohol and derivatives thereof, polyvinyl pyrrolidone and polyacrylamide, and copolymers thereof, a vinyl methyl ether/maleic anhydride copolymer, a vinyl acetate/maleic anhydride copolymer, and a styrene/maleic anhydride copolymer. Particularly, gum arabic, dextrin, and carboxymethyl cellulose are preferable. Two or more types of these water-soluble polymer compounds may be used in combination. The content of the water-soluble polymer compound is properly 0.1% by mass to 20% by mass and preferably 0.3% by mass to 10% by mass in the processing liquid.

As the wetting agent, ethylene glycol, propylene glycol, triethylene glycol, butylene glycol, hexylene glycol, diethylene glycol, dipropylene glycol, glycerin, trimethylolpropane, and diglycerin are suitably used. These wetting agents may be used singly or two or more types thereof may be used in combination. Generally, the wetting agent is used in the amount of 0.1% by mass to 5% by mass in the processing liquid.

As the preservative, phenol and derivatives thereof, formalin, imidazole derivatives, sodium dehydroacetate, 4-isothiazolin-3-one derivatives, benzisothiazolin-3-one, benzotriazole derivatives, amidine guanidine derivatives, quaternary ammonium salts, derivatives of pyridine, quinoline, and guanidine, diazine, triazole derivatives, oxazole, oxazine derivatives, nitro bromo alcohol-based 2-bromo-2-nitropropane-1,3diol, 1,1-dibromo-1-nitro-2-ethanol, and 1,1-dibromo-1-nitro-2-propanol can be preferably used. The addition amount is an amount stably exhibiting an effect on bacteria, fungi, and yeast, and may vary according to the kind of bacteria, mold, and yeast, but is preferably 0.01% by mass to 4% by mass in the processing liquid. It is preferable to use two or more types of preservatives so as to exhibit an effect on various kinds of molds and sterilization.

Examples of the chelating agent include organic phosphonic acids such as an ethylenediaminetetraacetic acid, potassium salts thereof and sodium salts thereof; a diethylenetriaminepentaacetic acid, potassium salts thereof and sodium salts thereof; a triethylenetetraminehexaacetic acid, potassium salts thereof and sodium salts thereof; a hydroxyethylethylenediaminetriacetic acid, potassium salts thereof and sodium salts thereof; a nitrilotriacetic acid and sodium salts thereof; a 1-hydroxyethane-1,1-diphosphonic acid, potassium salts thereof and sodium salts thereof; and an aminotri(methylenephosphonic acid), potassium salts thereof and sodium salts thereof or phosphono alkane tricarboxylic acids. Instead of sodium salts and potassium salts of chelating agents, salts of organic amines are effectively used. The addition amount is suitably 0.001% by mass to 1.0% by mass in the processing liquid.

As the defoaming agent, general silicon-based self-emulsifying type and emulsifying type defoaming agents and surfactant nonion-based compounds with HLB of 5 or less may be used. A silicon defoaming agent is preferable. Any one of an emulsified dispersion-type defoaming agent and a solubilization defoaming agent can be used. The addition amount of the defoaming agent is preferably 0.001% by mass to 1.0% by mass in the processing liquid.

[Processing Method of Lithographic Printing Plate Precursor]

The processing method of the lithographic printing plate precursor according to the invention is performed by causing an image-wisely exposed on-press development-type lithographic printing plate precursor to come into contact with the processing liquid including the basic coloring dye and the anionic surfactant according to the invention. Accordingly, the unexposed region of the image recording layer of the lithographic printing plate precursor is removed, and at the same time, an image portion is colored. As a result, the plate inspection and the image quality control can be easily performed.

Specifically, this method includes (1) a step of image-wisely exposing a lithographic printing plate precursor, (2) a step of removing a non-image portion of an image recording layer and coloring an image portion by causing the lithographic printing plate precursor to come into contact with the processing liquid including the basic coloring dye and the anionic surfactant according to the invention, and (3) a water washing step. After the water washing step, a drying step is performed to obtain the lithographic printing plate.

The step of image-wisely exposing the lithographic printing plate precursor is performed by laser exposure through a transparent original image having a linear image, a half-tone dot image, and the like, laser beam scanning exposure by digital data, or the like.

As the light source used for the image-wise exposure, laser is preferable. The laser is not particularly limited, but a solid laser and a semiconductor layer that apply infrared rays with wavelengths of 760 nm to 1200 nm are suitably used. The output of the infrared laser is preferably 100 mW or greater, the exposure time per one pixel is preferably within 20 microseconds, and the irradiation energy amount is preferably 10 mJ/cm$^2$ to 300 mJ/cm$^2$. In order to reduce the exposure time, a multibeam laser device is preferably used. An exposure mechanism may be any one of an inner drum type, an outer drum type, a flatbed type, and the like.

The image-wise exposure can be performed by a conventional method such as a plate setter.

Specific examples of the process include a manual process, an immersion process, a process by an automatic development apparatus, and the like. In the case of the manual process, the process is performed by causing the processing liquid according to the invention to be sufficiently included in a sponge or absorbent cotton and rubbing the entire surface of the lithographic printing plate precursor, and water washing is sufficiently performed after the process is completed. In the case of the immersion process, the lithographic printing plate precursor is immersed in a container such as a tray filled with the processing liquid according to the invention for about 10 to 180 seconds, is taken out after being stirred, and is sufficiently washed with water while being rubbed with a sponge or absorbent cotton. In the process by the automatic development apparatus, an automatic development apparatus known to be used for a PS plate in the related art can be used. Examples of the automatic development apparatus include a type that performs a development process by drawing a developing liquid of a development tank with a pump and spraying the developing liquid from a spray nozzle, a type that performs a process by immersing and transporting a lithographic printing plate precursor by an in-liquid guide roller in a developing liquid tank filled with a developing liquid, and a so-called disposable type that performs a process by supplying a substantially unused developing liquid in an amount required for one plate, and all types can be employed. In any types, it is preferable to be included in a rubbing mechanism by a brush or a molton. The process by the automatic development apparatus can be performed by using the processing liquid according to the invention instead of the developing liquid. After the process by the processing liquid in the automatic development apparatus, water washing is sufficiently performed. The water washing may be performed in the automatic development apparatus, or may be independently performed after the lithographic printing plate precursor is taken out from the automatic development apparatus.

Generally, the process by the processing liquid according to the invention is performed preferably at 15° C. to 35° C.

In the step (2), removing of the non-image portion of the image recording layer by the processing liquid according to the invention and coloring of the image portion are performed at the same time, but the image portion may be colored by using the processing liquid of the invention after the non-image portion of the image recording layer is removed by using another processing liquid (for example, developing liquid, gum liquid and dampening water).

[Plate Inspection and Image Quality Control]

The plate inspection can be performed by a conventional method by using the lithographic printing plate obtained by the process described above.

The image quality control is preferably performed by measuring a halftone dot area or concentration of the image in the lithographic printing plate obtained by the process described above with a halftone dot area measuring machine or a concentration meter. In the measurement, all of a halftone dot area measuring machine D19C manufactured by GretagMacbeth AG, a reflection concentration meter in the related art such as a reflection concentration meter manufactured by X-Rite, Inc., and iC PlateII and X-RiteDot manufactured by GretagMacbeth AG that measure a percentage of halftone dots with an embedded video camera can be used.

[Lithographic Printing Plate Precursor]

The lithographic printing plate precursor used in the invention preferably has an image recording layer including components (A) to (D) described below on a support. If necessary, the lithographic printing plate precursor may have an undercoat layer between the support and the image recording layer and a protection layer on the image recording layer.

Hereinafter, the lithographic printing plate precursor used in the invention is described in detail.

[Image Recording Layer]

The image recording layer preferably contains (A) an infrared absorber, (B) a polymerization initiator, (C) a polymerizable compound, and (D) a binder polymer.

[(A) Infrared Absorber]

The infrared absorber is not particularly limited as long as the infrared absorber absorbs light at the time of image-exposure to be in an excitation state, donates energy by electron transfer, energy transfer, or heat generation to the polymerization initiator, and improves a polymerization initiating function. Particularly, an infrared absorber having a maximum absorption in a wavelength range of 750 nm to 1400 nm is preferably used. As the infrared absorber, a dye or a colorant is preferably used.

As the dye, commercially available dyes and well-known dyes disclosed in, for example, "dye handbook" (edited by Synthetic Organic Chemistry, 1970 (S45)) can be used. Specific examples include dyes such as azo dyes, metal complex salt azo dyes, pyrazolone azo dyes, naphthoquinone dyes, anthraquinone dyes, phthalocyanine dyes, carbonium dyes, quinone imine dyes, methine dyes, cyanine dyes, squarylium coloring matters, pyrylium salts, and metal thiolate complexes.

Particularly preferable examples of the dyes include cyanine dyes, squarylium coloring matters, pyrylium salts, nickel thiolate complexes, and indolenine cyanine coloring matters. Further, cyanine dyes or indolenine cyanine coloring matters are preferable, and particularly preferable examples thereof include cyanine coloring matters expressed by General Formula (IV) below.

General Formula (IV)

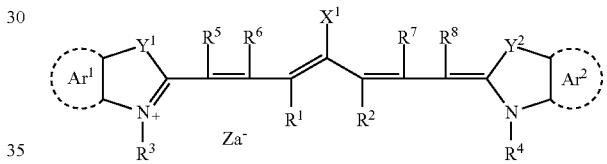

In General Formula (IV), $X^1$ represents a hydrogen atom, a halogen atom, $-N(R^9)(R^{10})$, $-X^2-L^1$, or groups presented below. Here, $R^9$ and $R^{10}$ may be identical to or different from each other, and represent an aromatic hydrocarbon group having 6 to 10 carbon atoms that may have a substituent, an alkyl group having 1 to 8 carbon atoms, and a hydrogen atom. Otherwise, $R^9$ and $R^{10}$ may be bonded to each other, to form a ring. Among these, a phenyl group is preferable. $X^2$ represents an oxygen atom or a sulfur atom, and $L^1$ represents a hydrocarbon group having 1 to 12 carbon atoms, an aromatic ring that includes a heteroatom (N, S, O, halogen atom, and Se), and a hydrocarbon group having 1 to 12 carbon atoms that includes a heteroatom. $Xa^-$ in the formula below is defined in the same manner as $Za^-$ as described below, and $R^a$ represents a substituent selected from a hydrogen atom, an alkyl group, an aryl group, a substituted or unsubstituted amino group, and a halogen atom.

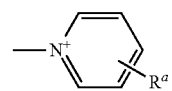

Each of $R^1$ and $R^2$ of General Formula (IV) independently represents a hydrocarbon group having 1 to 12 carbon atoms. From storage stability of a polymerizable composition solution, $R^1$ and $R^2$ each are preferably a hydrocarbon group having 2 or more carbon atoms. In addition, $R^1$ and $R^2$ are linked to each other to form a ring, and when a ring is forming, a 5-membered ring or a 6-membered ring is particularly preferably formed.

$Ar^1$ and $Ar^2$ may be identical to or different from each other, and each represents an aryl group that may have a substituent. Preferable examples of an aryl group include a benzene ring group and a naphthalene ring group. In addition, preferable examples of a substituent include a hydrocarbon group having 12 or less carbon atoms, a halogen atom, and an alkoxy group having 12 or less carbon atoms. $Y^1$ and $Y^2$ may be identical to or different from each other, and each represents a sulfur atom or a dialkyl methylene group having 12 or less carbon atoms. $R^3$ and $R^4$ may be identical to or different from each other and represents a hydrocarbon group having 20 or less carbon atoms that may have a substituent. Preferable examples of a substituent include an alkoxy group having 12 or less carbon atoms, a carboxy group, and a sulfo group. $R^5$, $R^6$, $R^7$, and $R^8$ may be identical to or different from each other, and each represents a hydrogen atom or a hydrocarbon group having 12 or less carbon atoms. From ease of acquisition of raw materials, a hydrogen atom is preferable. In addition, $Za^-$ represents a counter anion. However, if a cyanine coloring matter expressed by General Formula (IV) has an anionic substituent in a structure thereof, and charges are not required to be neutralized, $Za^-$ is not necessary. From storage stability of a polymerizable composition solution, preferable examples of $Za^-$ include a halide ion, a perchlorate ion, a tetrafluoroborate ion, a hexafluorophosphate ion, and a sulfonate ion, and particularly preferably a perchlorate ion, a hexafluorophosphate ion, and an arylsulfonate ion.

Specific examples of the cyanine coloring matter expressed by General Formula (IV) include compounds disclosed in paragraphs "0017" to "0019" of JP2001-133969A, and compounds disclosed in paragraphs "0016" to "0021" of JP2002-023360A and paragraphs "0012" to "0037" of JP2002-040638A. Compounds disclosed in paragraphs "0034" to "0041" of JP2002-278057A, and paragraphs "0080" to "0086" of JP2008-195018A are preferable, and compounds disclosed in paragraphs "0035" to "0043" of JP2007-90850A are particularly preferable.

In addition, compounds disclosed in paragraphs "0008" to "0009" of JP1993-5005A (JP-H5-5005A) and paragraphs "0022" to "0025" of JP2001-222101A can be preferably used.

Hereinafter, preferable specific examples of the infrared absorber are described below, but the invention is not limited thereto.

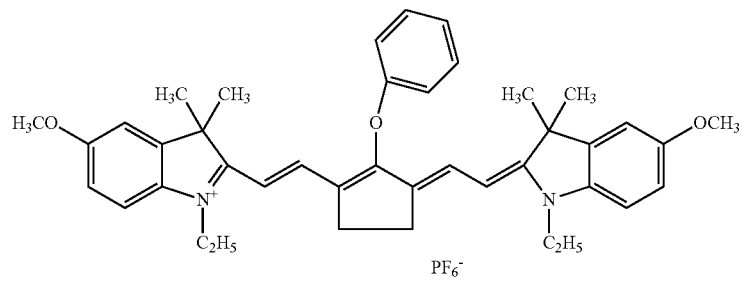

IR-1

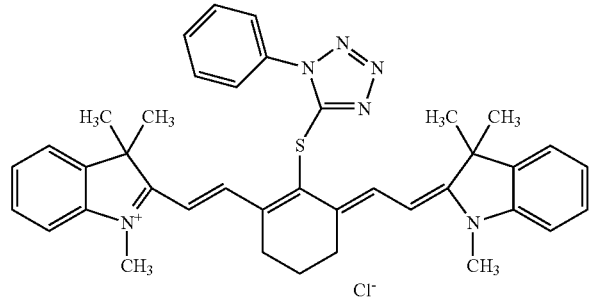

IR-2

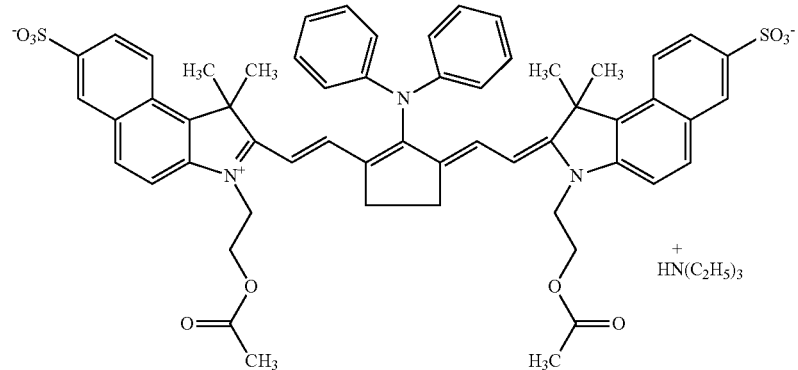

IR-3

-continued
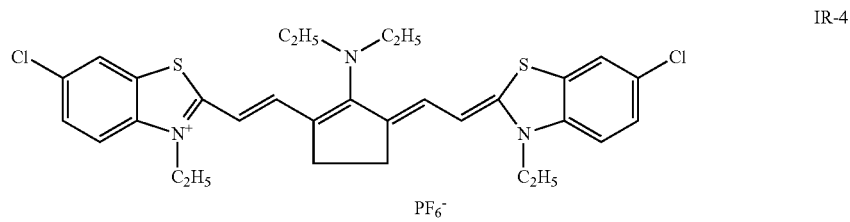
IR-4
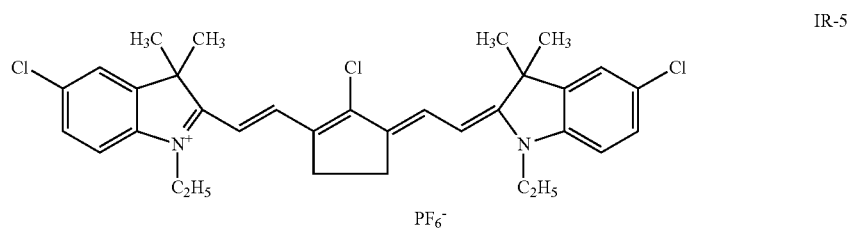
IR-5
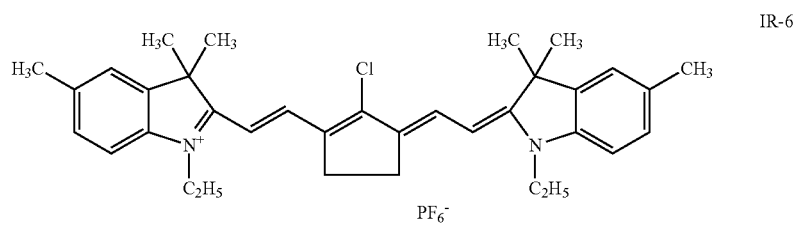
IR-6
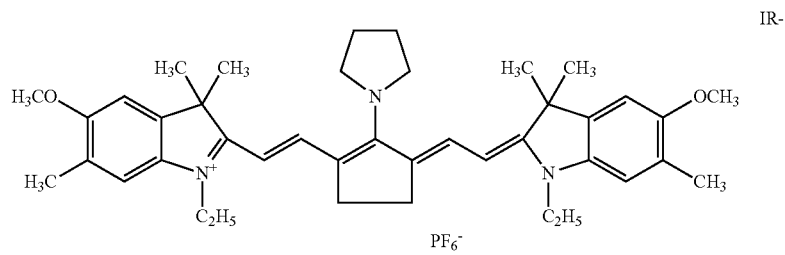
IR-7
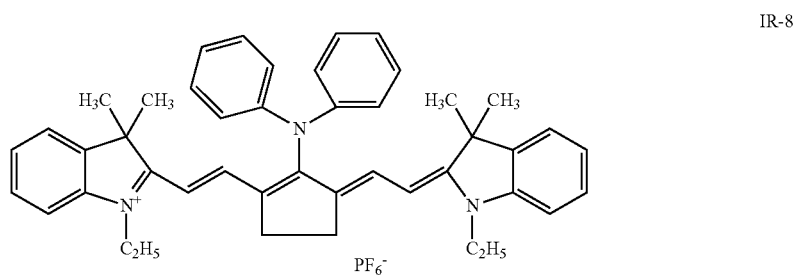
IR-8
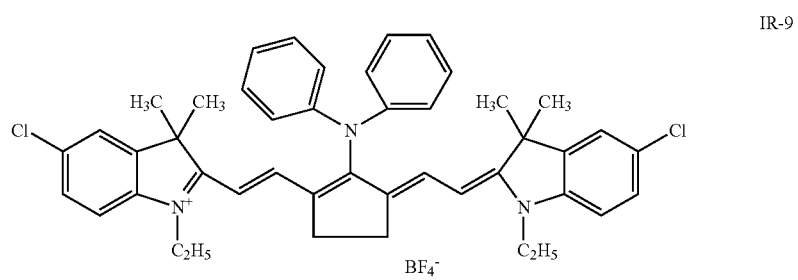
IR-9

-continued

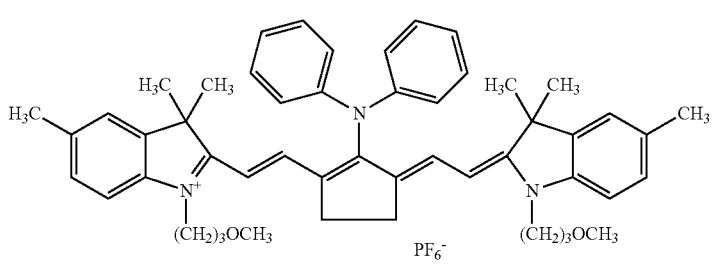

IR-10

These infrared absorbers may be used singly or two or more types thereof may be used in combination, and an infrared absorber such as a colorant may be used in combination. Preferable examples of the colorant include compounds described in paragraphs "0072" to "0076" of JP2008-195018A.

The content of the infrared absorber is preferably 0.05 parts by mass to 30 parts by mass, more preferably 0.1 parts by mass to 20 parts by mass, and particularly preferably 0.2 parts by mass to 10 parts by mass with respect to 100 parts by mass of the total solid content of the image recording layer.

[(B) Polymerization Initiator]

As the polymerization initiator, (a) an organic halide, (b) a carbonyl compound, (c) an azo compound, (d) organic peroxide, (e) a metallocene compound, (f) an azide compound, (g) a hexaarylbiimidazole compound, (h) a borate compound, (i) a disulfone compound, (j) an oxime ester compound, (k) an onium salt compound, and the like can be used.

As (a) the organic halide, compounds disclosed in paragraphs "0022" to "0023" of JP2008-195018A are preferable.

As (b) the carbonyl compound, compounds disclosed in paragraph "0024" of JP2008-195018A are preferable.

As (c) the azo compound, for example, azo compounds disclosed in JP1996-108621A (JP-H8-108621A) and the like can be used.

As (d) the organic peroxide, for example, compounds disclosed in paragraph "0025" of JP2008-195018A are preferable.

As (e) the metallocene compound, for example, compounds disclosed in paragraph "0026" of JP2008-195018A are preferable.

An example of (f) the azide compound includes a compound such as 2,6-bis(4-azidobenzylidene)-4-methylcyclohexanone.

As (g) the hexaarylbiimidazole compound, for example, compounds disclosed in paragraph "0027" of JP2008-195018A are preferable.

As (h) the borate compound, for example, compounds disclosed in paragraph "0028" of JP2008-195018A are preferable.

Examples of (i) the disulfone compound include compounds disclosed in JP1986-166544A (JP-S61-166544A) and JP2002-328465A.

As (j) the oxime ester compound, for example, compounds disclosed in paragraphs "0028" to "0030" of JP2008-195018A are preferable.

Examples of (k) the onium salt compound include onium salts such as diazonium salts disclosed in S. I. Schlesinger, Photogr. Sci. Eng., 18, 387 (1974), T. S. Bal et al., Polymer, 21, 423 (1980) and JP1993-158230A (JP-H5-158230A), ammonium salts disclosed in U.S. Pat. No. 4,069,055A and JP1992-365049A (JP-H4-365049A), phosphonium salts disclosed in U.S. Pat. No. 4,069,055A and U.S. Pat. No. 4,069,056A, iodonium salts disclosed in EP104143B US2008/0311520A, JP1990-150848A (JP-H2-150848A), JP2008-195018A, or J. V. Crivello et al., Macromolecules, 10(6), 1307 (1977), sulfonium salts disclosed in EP370693B, EP233567B, EP297443B, EP297442B, U.S. Pat. No. 4,933,377A, U.S. Pat. No. 4,760,013A, U.S. Pat. No. 4,734,444A, U.S. Pat. No. 2,833,827A, DE2904626B, DE3604580B, and DE3604581B, selenonium salts disclosed in J. V. Crivello et al., J. Polymer Sci., Polymer Chem. Ed., 17, 1047 (1979), arsonium salts disclosed in C. S. Wen et al., Teh, Proc. Conf. Rad. Curing ASIA, p. 478, Tokyo, October (1988), and azinium salts disclosed in JP2008-195018A.

Among these, an iodonium salt and a borate compound are preferable. Particularly, it is preferable to use these in combination. Hereinafter, specific examples of these compounds are presented, but the invention is not limited thereto.

As an example of the iodonium salt, a diphenyliodonium salt is preferable, an electron donating group, for example, a diphenyliodonium salt substituted with an alkyl group or an alkoxyl group is particularly preferable, and an asymmetrical diphenyliodonium salt is more preferable. Specific examples thereof include diphenyliodonium=hexafluorophosphate, 4-methoxyphenyl-4-(2-methylpropyl) phenyliodonium=hexafluorophosphate, 4-(2-methylpropyl) phenyl-p-tolyl iodonium=hexafluorophosphate, 4-hexyloxy phenyl-2,4,6-trimethoxyphenyl iodonium=hexafluorophosphate, 4-hexyloxyphenyl-2,4-diethoxyphenyliodonium=tetrafluoroborate, 4-octyloxyphenyl-2,4,6-trimethoxyphenyliodonium=1-perfluorobutanesulfonate, 4-octyloxyphenyl-2,4,6-trimethoxyphenyliodonium=hexafluorophosphate, and bis (4-t-butylphenyl)iodonium=tetraphenylborate.

Specific examples of the borate compound include tetraphenylborate salts, tetratolylborate salts, tetrakis(4-methoxyphenyl)borate salts, tetrakis(pentafluorophenyl)borate salts, tetrakis(3,5-bis(trifluoromethyl)phenyl)borate salts, tetrakis(4-chlorophenyl)borate salts, tetrakis(4-fluorophenyl)borate salts, tetrakis(2-thienyl)borate salts, tetrakis (4-phenyl-phenyl)borate salts, tetrakis(4-t-butylphenyl)borate salts, ethyltriphenylborate salts, and butyltriphenylborate salts. In view of compatibility between printing durability and tone reproducibility, tetraphenylborate salts are preferable. Examples of counter cations of these borate salts include cations well-known in the related art, such as alkaline metal cations, alkaline earth metal cations, ammonium cations, phosphonium cations, sulfonium cations, iodonium cations, diazonium cations, and azinium cations.

[(C) Polymerizable Compound]

The polymerizable compound used in the image recording layer is not particularly limited. A polymerizable compound having at least one ethylenically unsaturated double bond is preferable, a polymerizable compound having at least one terminal ethylenically unsaturated bond is more preferable, and a polymerizable compound having at least two terminal ethylenically unsaturated bonds is particularly preferable. The preferable polymerizable compound has, for example, a chemical form of a monomer, a prepolymer, that is, a dimer, a trimer, and an oligomer, or a mixture thereof.

Examples of the monomer include unsaturated carboxylic acids (for example, an acrylic acid, a methacrylic acid, an itaconic acid, a crotonic acid, an isocrotonic acid, and a maleic acid), esters thereof, and amides thereof. An ester between an unsaturated carboxylic acid and an polyhydric alcohol compound; amides between an unsaturated carboxylic acid and a polyvalent amine compound are preferably used. In addition, an addition-reaction product of an unsaturated carboxylic ester or amides having a nucleophilic substituent such as a hydroxyl group, an amino group, or a mercapto group, with monofunctional or multifunctional isocyanates or epoxies; a dehydration condensation reaction product thereof with a monofunctional or multifunctional carboxylic acid, and the like are also suitably used. An addition-reaction product of an unsaturated carboxylic ester or amides having an electrophilic substituent such as an isocyanate group or an epoxy group, with monofunctional or multifunctional alcohols, amines, or thiols; or a substitution-reaction product of an unsaturated carboxylic ester or amides having a dissociative substituent such as a halogen group or a tosyloxy group, with monofunctional or multifunctional alcohols, amines or thiols are also suitable. In addition, as other examples, compound groups in which the unsaturated carboxylic acid is replaced by an unsaturated phosphonic acid, styrene, vinyl ether, or the like can be used. These are disclosed in JP2006-508380A, JP2002-287344A, JP2008-256850A, JP2001-342222A, JP1997-179296A (JP-H9-179296A), JP1997-179297A (JP-H9-179297A), JP1997-179298A (JP-H9-179298A), JP2004-294935A, JP2006-243493A, JP2002-275129A, JP2003-64130A, JP2003-280187A, and JP1998-333321A (JP-H10-333321A).

Specific examples of a monomer of the ester between a polyhydric alcohol compound and an unsaturated carboxylic acid include, as an acrylic ester, ethylene glycol diacrylate, 1,3-butane diol diacrylate, tetramethylene glycol diacrylate, propylene glycol diacrylate, trimethylol propane triacrylate, hexane diol diacrylate, tetraethylene glycol diacrylate, pentaerythritol tetraacrylate, sorbitol triacrylate, isocyanuric acid ethylene oxide (EO)-modified triacrylate, and a polyester acrylate oligomer. Examples of the methacrylic acid ester include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethylmethane, and bis-[p-(methacryloxyethoxy)phenyl] dimethylmethane. In addition, specific examples of a monomer of the amide between a polyvalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bismethacrylamide.

In addition, an urethane-based addition-polymerizable compound manufactured by addition reaction between isocyanate and a hydroxyl group is suitable. Specific examples thereof include a vinyl urethane compound containing two or more polymerizable vinyl groups in one molecule in which a vinyl monomer containing a hydroxyl group expressed by General Formula (A) below is added to a polyisocyanate compound having two or more isocyanate groups in one molecule disclosed in JP1973-41708B (JP-S48-41708B), and the like.

$$CH_2=C(R^4)COOCH_2CH(R^5)OH \qquad (A)$$

(However, each of $R^4$ and $R^5$ independently represents H or $CH_3$.)

In addition, urethaneacrylates disclosed in JP1976-37193A (JP-S51-37193A), JP1990-32293B (JP-H2-32293B), JP1990-16765B (JP-H2-16765B), JP2003-344997A, and JP2006-65210A, urethane compounds having an ethylene oxide-based skeleton disclosed in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-94138A, and urethane compounds having hydrophilic groups disclosed in U.S. Pat. No. 7,153,632B, JP1996-505958A (JP-H8-505958A), JP2007-293221A, and JP2007-293223A are suitable.

In view of excellent balance between hydrophilicity involving on-press developability and polymerization ability involving printing durability, isocyanuric acid ethylene oxide-modified acrylates such as tris(acryloyloxyethyl) isocyanurate and bis(acryloyloxyethyl)hydroxyethyl isocyanurate are particularly preferable.

Details of usage methods such as structures, usage forms (using singly, or using two or more types in combination, and the like), and addition amounts of these polymerizable compounds can be arbitrarily set according to the performance design of the final lithographic printing plate precursor. The polymerizable compound is preferably 5% by mass to 75% by mass, more preferably 10% by mass to 70% by mass, and particularly preferably 14% by mass to 60% by mass with respect to the total solid content of the image recording layer.

[(D) Binder Polymer]

The image recording layer contains a binder polymer. The binder polymer is not particularly limited as long as the binder polymer can provide coating properties to the image recording layer. The binder polymer well-known in the art can be used. The binder polymer may have a straight chain shape or a star-shaped structure as disclosed in JP2007-249036A.

Since the image recording layer according to the invention is required to have properties in which an unexposed region thereof can be removed with at least one of dampening water and printing ink by on-press development, the binder polymer is preferably appropriate for on-press development. Examples of the binder polymer appropriate for the on-press development include a binder polymer having a polyoxyalkylene structure.

The binder polymer having the polyoxyalkylene structure may have a polyoxyalkylene structure in a main chain or in a side chain, but it is preferable that the binder polymer has a polyoxyalkylene structure in a side chain. In addition, the binder polymer may be a graft polymer having a polyoxyalkylene structure in a side chain and a block copolymer of a block constituted of a repeating unit containing a polyoxyalkylene structure and a block constituted of a repeating unit not containing a polyoxyalkylene structure.

In the case where a polyoxyalkylene structure is in a main chain, a polyurethane resin is preferable. Examples of the polymer of a main chain in the case where a polyoxyalkylene structure is in a side chain include an acrylic resin, a polyvinyl acetal resin, a polyurethane resin, a polyurea resin, a polyimide resin, a polyamide resin, an epoxy resin, a methacrylic resin, a polystyrene-based resin, a novolac-type phenolic resin, a polyester resin, synthetic rubber, and natural rubber, and an acrylic resin is particularly preferable.

As oxyalkylene constituting a polyoxyalkylene structure, oxyalkylene having 2 to 6 carbon atoms is preferable, and oxyethylene or oxypropylene is particularly preferable.

The number of repetitions of the oxyalkylene unit in the polyoxyalkylene structure is properly 2 to 120, preferably 2 to 70, and more preferably 2 to 50.

It is preferable that when the number of repetitions of the oxyalkylene unit is 120 or less, both the printing durability by abrasion and the printing durability by the ink receptivity do not decrease.

The polyoxyalkylene structure is preferably contained in a structure expressed by General Formula (a) below as a side chain of the binder polymer. The polyoxyalkylene structure is more preferably contained in a structure expressed by General Formula (a) below, as a side chain of the acrylic resin.

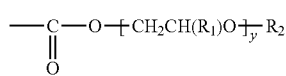

General Formula (a)

In General Formula (a), y represents 2 to 120, preferably 2 to 70, and more preferably 2 to 50. $R_1$ represents a hydrogen atom or an alkyl group, and $R_2$ represents a hydrogen atom or an organic group. As the organic group, an alkyl group having 1 to 6 carbon atoms is preferable, and examples thereof include a methyl group, an ethyl group, an n-propyl group, an isopropyl group, an n-butyl group, a sec-butyl group, an isobutyl group, a t-butyl group, a n-pentyl group, an isopentyl group, a neopentyl group, an n-hexyl group, an isohexyl group, a 1,1-dimethylbutyl group, a 2,2-dimethylbutyl group, a cyclopentyl group, and a cyclohexyl group.

$R_1$ is preferably a hydrogen atom or a methyl group, and a hydrogen atom is particularly preferable. $R_2$ is particularly preferably a hydrogen atom or a methyl group.

The binder polymer may be a polymer fine particle. Particularly, a polymer fine particle having a polyoxyalkylene structure is preferable. Among these, the polymer fine particle having a polyoxyalkylene structure in a side chain is preferable.

According to this, permeability of dampening water increases, and thus developability becomes favorable. As the polyoxyalkylene structure, an oxyalkylene structure having 2 to 120 oxyalkylene units having 2 or 3 carbon atoms is preferable, and a polyoxyethylene structure having 2 to 120 oxyethylene units is more preferable. A polyoxyethylene structure having 20 to 100 oxyethylene units is particularly preferable. Both printing durability and developability can be achieved by the polymer fine particle having a polyoxyalkylene structure. In addition, depositing properties can be improved.

The binder polymer may have crosslinking properties in order to enhance a film strength of the image portion. In order to cause the binder polymer to have crosslinking properties, a crosslinkable functional group such as an ethylenically unsaturated bond may be introduced into a main chain or a side chain of a polymer. The crosslinkable functional group may be introduced by copolymerization.

Examples of the polymer having the ethylenically unsaturated bond in the main chain of the molecule include poly-1,4-butadiene and poly-1,4-isoprene.

Examples of the polymer having an ethylenically unsaturated bond in the side chain of the molecule include a polymer of ester or amide of an acrylic acid or a methacrylic acid and a polymer in which a residue of an ester or an amide (R of —COOR or CONHR) has an ethylenically unsaturated bond.

Examples of the residue (R above) having an ethylenically unsaturated bond include —$(CH_2)_n CR^1$=$CR^2 R^3$, —$(CH_2O)_n CH_2 CR^1$=$CR^2 R^3$, —$(CH_2CH_2O)_n CH_2 CR^1$=$CR^2 R^3$, —$(CH_2)_n NH$—CO—O—$CH_2 CR^1$=$CR^2 R^3$, —$(CH_2)_n$—O—CO—$CR^1$=$CR^2 R^3$, and $(CH_2CH_2O)_2$—X (in the formulae, each of $R^1$ to $R^3$ independently represents a hydrogen atom, a halogen atom or an alkyl group, an aryl group, an alkoxy group, or an aryloxy group having 1 to 20 carbon atoms, and $R^1$ and $R^2$ or $R^3$ are bonded to each other to form a ring. n represents an integer of 1 to 10. X represents a dicyclopentadienyl residue).

Specific examples of the ester residue include —$CH_2CH$=$CH_2$ (disclosed in JP1995-21633B (JP-H7-21633B)), —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NHCOO—$CH_2CH$=$CH_2$, and $CH_2CH_2O$—X (in the formulae, X represents a dicyclopentadienyl residue).

Specific examples of the amide residue include —$CH_2CH$=$CH_2$, —$CH_2CH_2$—Y (in the formulae, Y represents a cyclohexane residue), and —$CH_2CH_2$—OCO—CH=$CH_2$.

The binder polymer having the crosslinking properties is cured by adding a free radical (propagation radical in polymerization process of polymerization initiation radical or polymerizable compound) to a crosslinkable functional group thereof, performing addition-polymerization directly between polymers or through a polymerization chain of the polymerizable compound, and forming a crosslink between polymer molecules. Otherwise, the binder polymer is cured by extracting an atom in a polymer (for example, hydrogen atom on carbon atom adjacent to crosslinkable functional group) by a free radical, generating polymer radicals, bonding the polymer radicals to each other, and forming a crosslink between polymer molecules.

A content of the crosslinkable group in a binder polymer (content of unsaturated double bond that can perform radical polymerization by iodine titration) is preferably 0.1 mmol to 10.0 mmol, more preferably 1.0 mmol to 7.0 mmol, and particularly preferably 2.0 mmol to 5.5 mmol per 1 g of the binder polymer. In this range, favorable sensitivity and favorable storage stability are obtained.

Specific examples (1) to (13) of the binder polymer used in the invention are provided below, but the invention is not limited thereto.

Among compounds exemplified below, numerical values (numerical values written together with main chain repeating units) written together with respective repeating units represent mole percentages of the repeating units. A numerical value written together with a repeating unit of a side chain indicates the number of repetitions of the corresponding repeating unit.

(1)
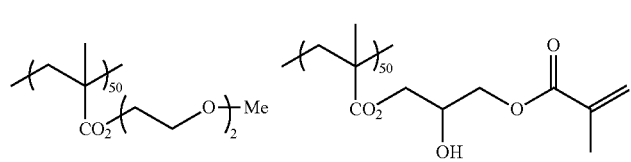
(2)
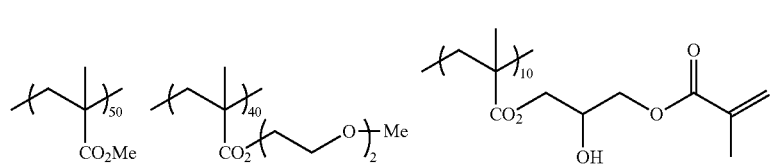
(3)
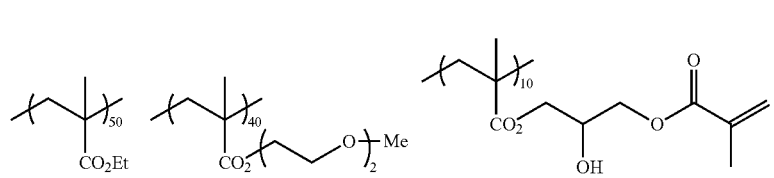
(4)
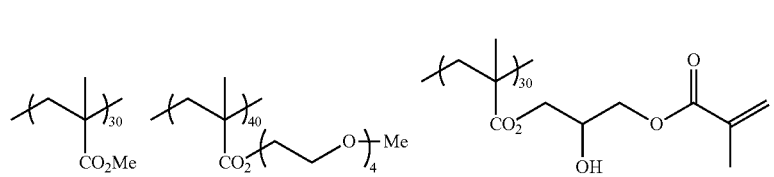
(5)
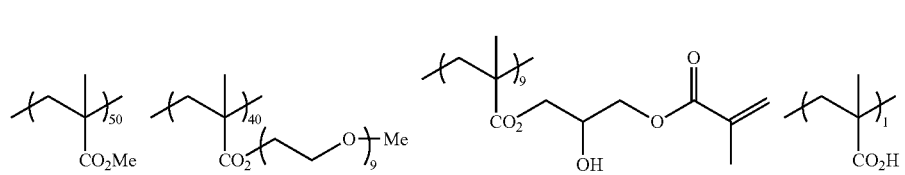
(6)
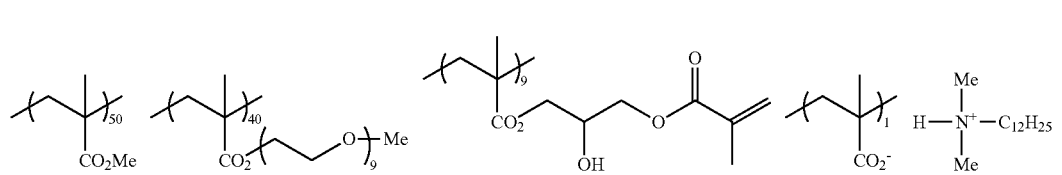
(7)
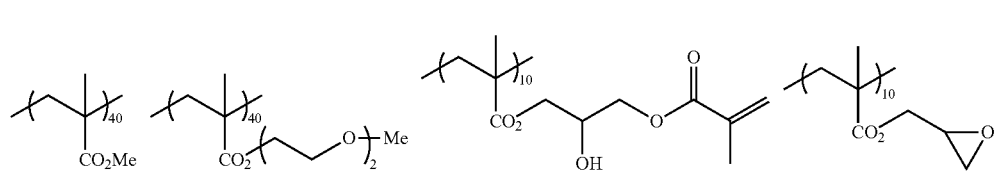
(8)
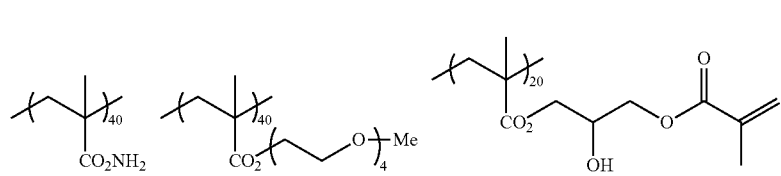

(9)
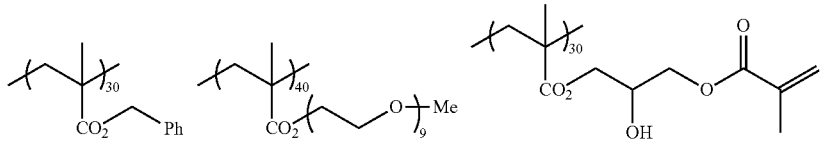
(10)
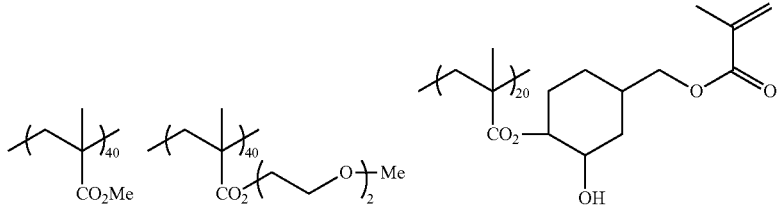
(11)
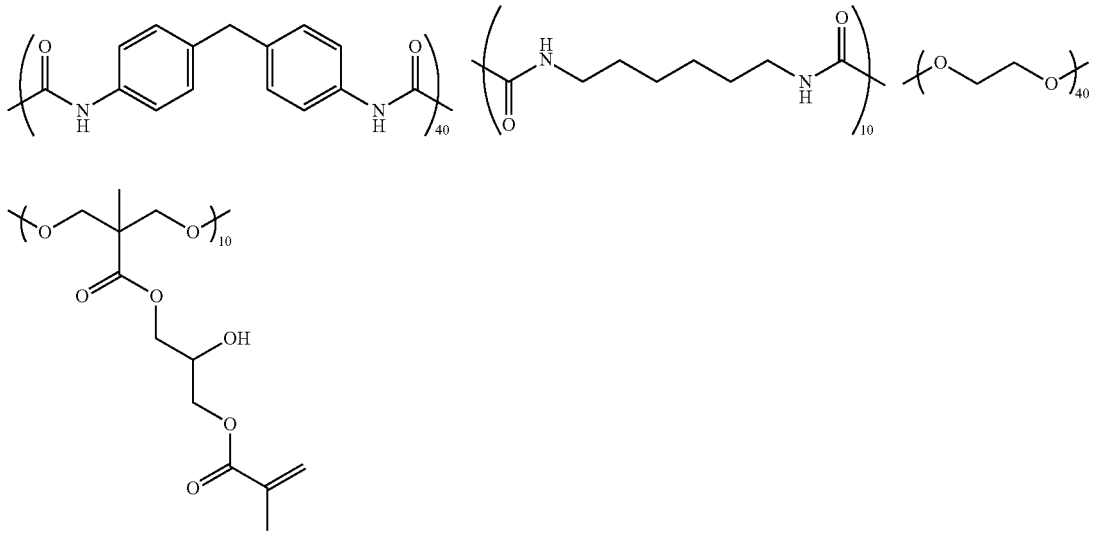
(12)
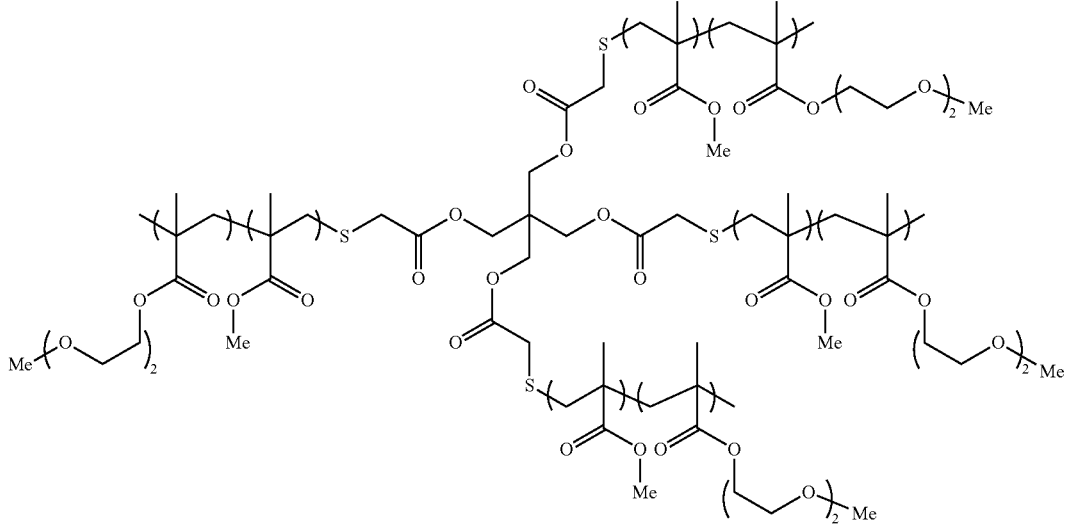

-continued (13)

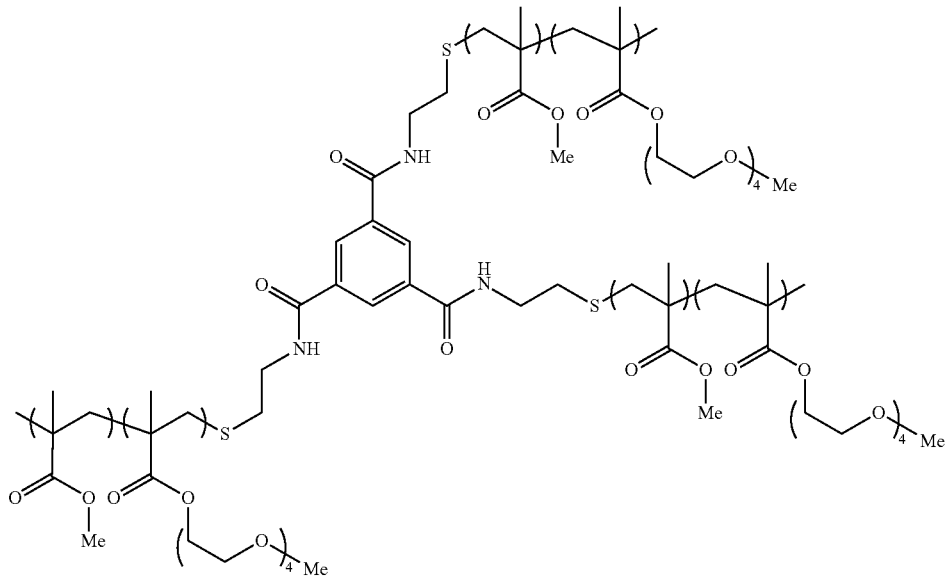

A mass average molar mass (Mw) of the binder polymer according to the invention is preferably 2,000 or greater, more preferably 5,000 or greater, and particularly preferably 10,000 to 300,000 calculated by polystyrene in a GPC method.

According to the invention, if necessary, a hydrophilic polymer compound such as a polyacrylic acid and polyvinyl alcohol disclosed in JP2008-195018A can be used in combination. In addition, a lipophilic polymer compound and a hydrophilic polymer compound may be used in combination.

In the image recording layer according to the invention, the form of the binder polymer may exist as a binder that achieves a function of linking respective materials or may exist in a form of a fine particle in the image recording layer. If the binder polymer exists as a fine particle form, the average particle diameter is generally 10 nm to 1,000 nm, preferably 20 nm to 300 nm, and more preferably 30 nm to 120 nm.

The binder polymer may be contained in an arbitrary amount in the image recording layer, but the content of the binder polymer is preferably 5% by mass to 90% by mass, more preferably 5% by mass to 80% by mass, and still more preferably 10% by mass to 70% by mass with respect to the total solid content constituting the image recording layer.

In the image recording layer according to the invention, a preferable combination of the the infrared absorber, the polymerization initiator, the polymerizable compound, and the binder polymer is a product of combining respective preferable forms thereof.

[Components Other than (A) Infrared Absorber, (B) Polymerization Initiator, (C) Polymerizable Compound, and (D) Binder Polymer]

The image recording layer according to the invention preferably includes (E) a hydrophobic precursor in addition to the components described above.

[(E) Hydrophobic Precursor]

As the hydrophobic precursor, at least one particle selected from a hydrophobic thermoplastic polymer fine particle, a thermally reactive polymer fine particle, a microcapsule including a hydrophobic compound, and microgel (crosslinking polymer fine particle) is preferable. Among these, a polymer fine particle and microgel having a polymerizable group are preferable. In order to enhance developability, as described above, the hydrophobic precursor may have a polyalkyleneoxide structure.

Examples of the hydrophobic thermoplastic polymer fine particle suitably include hydrophobic thermoplastic polymer fine particles disclosed in Research Disclosure No. 33303 of January 1992, JP1997-123387A (JP-H9-123387A), JP1997-131850A (JP-H9-131850A), JP1997-171249A (JP-H9-171249A), JP1997-171250A (JP-H9-171250A), and EP931647B.

Specific examples of the polymer constituting these polymer fine particles include ethylene, styrene, vinyl chloride, methyl acrylate, ethyl acrylate, methyl methacrylate, ethyl methacrylate, vinylidene chloride, acrylonitrile, vinyl carbazole, acrylate having a polyalkylene structure, or a homopolymer or a copolymer of a monomer such as methacrylate, or a mixture thereof. Among these, examples thereof more suitably include a copolymer including polystyrene, styrene, and acrylonitrile, and polymethyl methacrylate.

The average particle diameter of the hydrophobic thermoplastic polymer fine particle used in the invention is preferably 0.01 µm to 2.0 µm.

An example of the thermally reactive polymer fine particle used in the invention includes a polymer fine particle having a thermally reactive group, and these form a hydrophobic area by a crosslink due to thermal reaction and a change in functional groups at the time of the crosslinking.

As the thermally reactive group in the polymer fine particle having a thermally reactive group used in the invention, a functional group performing any kind of reaction can be used, as long as a chemical bond is formed. However, examples thereof suitably include an ethylenically unsaturated group that performs a radical polymerization reaction (for example, an acryloyl group, a methacryloyl group, a vinyl group, and an allyl group), a cationic polymerizable group (for example, a vinyl group and a vinyloxy group), an isocyanate group that performs addition reaction or a block body thereof, an epoxy group, a vinyloxy group, and a functional group having an active hydrogen atom which is a reaction counterpart thereof (for example, an amino group, a hydroxy group, and a carboxy group), a carboxy group that performs condensation reaction, a hydroxy group or an amino group which is a reaction counterpart, an acid anhydride that performs ring opening addition reaction, and an amino group or a hydroxy group which is a reaction counterpart.

Examples of the microcapsules used in the invention include microcapsules including all or a portion of constituent components of the image recording layer as disclosed in JP2001-277740A, JP2001-277742A, and EP2383118A. In addition, constituent components of the image recording layer can be contained in a portion other than the microcapsule. In addition, a preferable form of the image recording layer containing the microcapsule is to include the hydrophobic constituent component in the microcapsule and contain the hydrophilic constituent component in a portion other than the microcapsule.

The invention may have a form of containing crosslinking resin particles, that is, in the form of a microgel. The microgel may contain a portion of the constituent component of the image recording layer therein and/or on a surface thereof, and particularly, a form of reactive microgel by having (B) a polymerizable compound on a surface thereof is particularly preferable in view of image forming sensitivity or printing durability.

As a method of microcapsulating or microgelling the constituent component of the image recording layer, well-known methods can be applied.

The average particle diameter of the microcapsule or the microgel is preferably 0.01 µm to 3.0 µm, more preferably 0.05 µm to 2.0 µm, and particularly preferably 0.10 µM to 1.0 µm. In this range, favorable resolution and time stability can be obtained.

The content of the polymer fine particle is preferably 5% by mass to 90% by mass with respect to the total solid content of the image recording layer.

[(F) Other Components]

If necessary, the image recording layer according to the invention may further contain the components below.

(F-1) Low Molecular Hydrophilic Compound

The image recording layer may contain a low molecular hydrophilic compound in order to increase on-press developability without decreasing printing durability.

Examples of the low molecular hydrophilic compound include glycols such as ethylene glycol, diethylene glycol, triethylene glycol, propylene glycol, dipropylene glycol, and tripropylene glycol, ethers thereof or ester derivatives thereof, polyols such as glycerol, pentaerythritol, and tris(2-hydroxyethyl)isocyanurate, organic amines such as triethanolamine, diethanolamine, monoethanolamine, and salts thereof, organic sulfonic acids such as an alkylsulfonic acid, a toluenesulfonic acid, and a benzenesulfonic acid, and salts thereof, an organic sulfamic acid such as an alkyl sulfamic acid, and salts thereof, organic sulfuric acids such as alkyl sulfates and alkyl ether sulfate, and salts thereof, an organic phosphonic acid such as a phenylphosphonic acid and salts thereof, an organic carboxylic acid such as a tartaric acid, an oxalic acid, a citric acid, a malic acid, a lactic acid, a gluconic acid, and an amino acid, and salts thereof, and betaines.

According to the invention, the image recording layer preferably contains at least one selected from the group consisting of polyols, organic sulfate salts, organic sulfonic acid salts, and betaines.

Specific compounds of the organic sulfonic acid salts include alkyl sulfonic acid salts such as a sodium n-butyl sulfonate, an sodium n-hexyl sulfonate, 2-ethylhexyl sodium sulfonate, a sodium cyclohexyl sulfonate, and sodium n-octyl sulfonate; alkyl sulfonic acid salts including an ethylene oxide chain such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, and sodium 5,8,11,14-tetraoxatetracosane-1-sulfonate; aryl sulfonic acid salts such as sodium benzenesulfonate, a sodium p-toluenesulfonate, sodium p-hydroxy benzene sulfonate, sodium p-styrene sulfonate, sodium dimethyl isophthalate-5-sulfonate, sodium 1-naphthyl sulfonate, sodium 4-hydroxy-naphthyl sulfonate, disodium 1,5-naphthalene disulfonate, and trisodium 1,3,6-naphthalene trisulfonate; and compounds disclosed in paragraphs "0026" to "0031" of JP2007-276454A and paragraphs "0020" to "0047" of JP2009-154525A. These salts may be potassium salts or lithium salts.

Examples of the organic sulfuric acid salts include alkyl, alkenyl, alkynyl, and aryl of polyethylene oxide or sulfuric acid salts of polycyclic monoether. The ethylene oxide unit is preferably 1 to 4, and the salts are preferably sodium salts, potassium salts, or lithium salts. Specific examples thereof include compounds disclosed in paragraphs "0034" to "0038" of JP2007-276454A.

As betaines, a compound in which a hydrocarbon substituent to a nitrogen atom has 1 to 5 carbon atoms is preferable, and specific examples thereof include trimethylammonium acetate, dimethyl propyl ammonium acetate, 3-hydroxy-4-trimethylammonio butyrate, 4-(1-pyridinio) butyrate, 1-hydroxyethyl-1-imidazolio acetate, trimethylammonium methanesulfonate, dimethyl propyl ammonium methanesulfonate, 3-trimethyl ammonio-1-propane sulfonate, and 3-(1-pyridinio)-1-propane sulfonate.

The low molecular hydrophilic compound has a small structure of a hydrophobic portion, and thus a surfactant action is scarce. Therefore, dampening water does not permeate an exposed portion (image portion) of the image recording layer to decrease hydrophobicity of the image portion and film strength, and ink receptivity of the image recording layer and printing durability are favorably maintained.

The addition amount of the low molecular hydrophilic compound to the image recording layer is preferably 0.5% by mass to 20% by mass, more preferably 1% by mass to 15% by mass, and still more preferably 2% by mass to 10% by mass of the total solid content amount of the image recording layer. In this range, favorable on-press developability and printing durability can be obtained.

The low molecular hydrophilic compound may be used singly, or two or more types thereof may be used in combination.

(F-2) Sensitizing Agent

In order to enhance depositing properties, sensitizing agents such as a phosphonium compound, a nitrogen-containing low molecular compound, and an ammonium group-containing polymer can be used in the image recording layer. Particularly, if an inorganic layer-shaped compound is contained in the protection layer, these compounds function as a surface coating agent of the inorganic layer-shaped compound, and prevents a decrease in depositing properties in the middle of printing due to the inorganic layer-shaped compound.

Examples of the phosphonium compound suitably include phosphonium compounds disclosed in JP2006-297907A and JP2007-50660A.

Examples of the nitrogen-containing low molecular compound include amine salts and quaternary ammonium salts, and also include compounds disclosed in paragraphs "0021" to "0037" of JP2008-284858A and paragraphs "0030" to "0057" of JP2009-90645A.

Any ammonium group-containing polymer can be used, as long as the ammonium group-containing polymer has an ammonium group in a structure thereof, but a polymer containing 5% by mol to 80% by mol of (meth)acrylate having an ammonium group in a side chain as a copolymerization component is preferable. Specific examples thereof include the polymer disclosed paragraphs "0089" to "0105" of JP2009-208458A.

The content of the sensitizing agent is preferably 0.01% by mass to 30.0% by mass, more preferably 0.1% by mass to 15.0% by mass, and still more preferably 1% by mass to 10% by mass with respect to the total solid content of the image recording layer.

(F-3) Others

As the other components, a surfactant, a colorant, a printing agent, a polymerization inhibitor, a higher fatty acid derivative, a plasticizer, an inorganic fine particle, an inorganic layer-shaped compound, an assistant sensitizer, a chain transfer agent, or the like can be added. Specifically, compounds and addition amounts disclosed in paragraphs "0114" to "0159" of JP2008-284817A, paragraphs "0023" to "0027" of JP2006-091479A, and paragraph "0060" of US2008/0311520A are preferable.

[Forming of Image Recording Layer]

For example, as disclosed in paragraphs "0142" and "0143" of JP2008-195018A, the image recording layer according to the invention is formed by preparing a coating liquid by dispersing or dissolving respective required components in a solvent well-known in the art, coating a support with this in the well-known methods such as bar-coater coating, and performing drying. The coating amount (solid content) of the image recording layer on the support obtained after coating and drying varies according to the use thereof, but is preferably generally 0.3 to 3.0 g/m². In this range, favorable sensitivity and favorable film characteristics of the image recording layer can be obtained.

[Undercoat Layer]

The lithographic printing plate precursor according to the invention preferably has an undercoat layer (also referred to as intermediate layer) between the image recording layer and the support. The undercoat layer strengthens adhesion between the support and the image recording layer in the exposure portion and makes separation of the image recording layer from the support in the unexposed region easier. Therefore, the undercoat layer contributes to an increase in developability without deteriorating the printing durability. In addition, in the infrared laser exposure, the undercoat layer functions as a heat insulating layer, and thus prevents heat generated by exposure from diffusing to the support so as to decrease sensitivity.

As the compound used in the undercoat layer, compounds having an acid group such as a phosphonic acid, a phosphoric acid, and a sulfonic acid are preferably used. Further, in order to enhance adhesion properties between an adsorption group that can be adsorbed to the support surface and the image recording layer, it is preferable that a crosslinkable group is included. These compounds may be a low molecular compound or a polymer compound. Two or more types of these compounds may be used in combination, in necessary.

In the case of the polymer compound, a copolymer of a monomer having an adsorption group, a monomer having a hydrophilic group, and a monomer having a crosslinkable group is preferable. As the adsorption group that can be adsorbed to the support surface, a phenolic hydroxy group, a carboxy group, $—PO_3H_2$, $—OPO_3H_2$, $—CONHSO_2—$, $—SO_2NHSO_2—$, and $—COCH_2COCH_3$ are preferable. As the hydrophilic group, a sulfo group is preferable. As the crosslinkable group, a methacryl group, an allyl group, and the like are preferable. The polymer compound may have a crosslinkable group that is introduced by forming a salt with a substituent having opposite charges to a polar substituent of a polymer compound and a compound having an ethylenically unsaturated bond and may be copolymerized with a monomer other than the monomers described above, preferably a hydrophilic monomer.

Specifically, examples thereof suitably include silane coupling agents having an ethylenic double bond reactive group that can perform addition polymerization disclosed in JP1998-282679A (JP-H10-282679A), and phosphorous compounds that may have an ethylenic double bond reactive group disclosed in JP1990-304441A (JP-H2-304441A). Crosslinkable groups (preferably ethylenically unsaturated bonding group) disclosed in JP2005-238816A, JP2005-125749A, JP2006-239867A, JP2006-215263A, and JP2011-245846A, functional groups that interact with the support surface, or products containing low molecular or polymer compounds having hydrophilic groups are also preferably used. Polymer compounds having crosslinkable groups, hydrophilic groups, and adsorption groups that are absorbable in support surfaces disclosed in JP2005-125749A, JP2006-188038A, and JP2011-245846A are particularly preferable.

The content of unsaturated double bonds in the polymer compound for the undercoat layer is preferably 0.1 mmol to 10.0 mmol and particularly preferably 0.2 mmol to 5.5 mmol per 1 g of the polymer compound.

With respect to the polymer compound for the undercoat layer, a mass average molar mass is preferably 5,000 or more and more preferably 10,000 to 300,000.

In addition to the compound for the undercoat layer, in order to prevent stains over time, the undercoat layer may contain a chelating agent, secondary or tertiary amine, a polymerization inhibitor, an amino group, or a compound having a group that interacts with a functional group having polymerization inhibiting ability and an aluminum support surface (for example, 1,4-diazabicyclo[2,2,2]octane (DABCO), 2,3,5,6-tetrahydroxy-p-quinone, chloranil, a sulfophthalic acid, a hydroxyethyl ethylene diamine triacetic acid, a dihydroxyethyl ethylenediamine diacetic acid, and hydroxy ethylimino diacetic acid).

The undercoat layer is coated in a well-known method. The coating amount (solid content) of the undercoat layer is preferably 0.1 mg/m² to 100 mg/m² and more preferably 1 mg/m² to 30 mg/m².

[Support]

As the support of the lithographic printing plate precursor according to the invention, a well-known support is used. Among them, the aluminum support subjected to a roughening process and an anodic oxidation process by a well-known method is preferable.

In addition, if necessary, enlargement processes or sealing processes of micropores of the anodic oxidation coating disclosed in JP2001-253181A or JP2001-322365A, and a surface hydrophilizing process by alkali metal silicate as disclosed in U.S. Pat. No. 2,714,066A, U.S. Pat. No. 3,181,461A, U.S. Pat. No. 3,280,734A, and U.S. Pat. No. 3,902,734A, or a polyvinyl phosphonic acid disclosed in U.S. Pat. No. 3,276,868A, U.S. Pat. No. 4,153,461A, and U.S. Pat. No. 4,689,272A are appropriately selected and performed on the aluminum support.

With respect to the support, the center line average roughness is preferably 0.10 μm to 1.2 μm.

If necessary, a back coat layer including an organic polymer compound disclosed in JP1993-45885A (JP-H5-45885A) and a silicon alkoxy compound disclosed in JP1994-35174A (JP-H6-35174A) can be provided to the back surface of the support used in the lithographic printing plate precursor.

[Protection Layer]

In the lithographic printing plate precursor, it is preferable that a protection layer (also referred to as an "overcoat layer") is provided on the image recording layer. The protection layer has a function of preventing generation of cracks in the image recording layer and preventing ablation at the time of high illuminance laser exposure in addition to a function of suppressing image formation inhibiting reaction by oxygen blockage.

Two or more protection layers in the lithographic printing plate precursor can be formed. For example, the protection layer may have a two-layer constitution of an upper protection layer and a lower protection layer.

For example, the protection layer is disclosed in U.S. Pat. No. 3,458,311A and JP1980-49729B (JP-S55-49729B). As an oxygen low permeable polymer used in the protection layer, any one of the water-soluble polymer and the water-insoluble polymer can be appropriately selected and used, and two or more types thereof may be used in a mixture. Specifically, examples thereof include polyvinyl alcohol, modified polyvinyl alcohol, polyvinyl pyrrolidone, a water-soluble cellulose derivative, and poly(meth)acrylonitrile.

As the modified polyvinyl alcohol, acid modified polyvinyl alcohol having a carboxy group or a sulfo group is preferably used. Specifically, modified polyvinyl alcohol disclosed in JP2005-250216A and JP2006-259137A is suitable.

In the protection layer, at least a repeating unit expressed by General Formula (1) below disclosed in JP2012-73597A and a hydrophilic polymer having a repeating unit expressed by General Formula (2) below can be used.

Particularly, a hydrophilic polymer (hereinafter, referred to as a "specific hydrophilic polymer (e)") having the repeating units expressed by General Formula (1) and General Formula (2) is preferably contained.

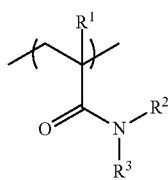

General Formula (1)

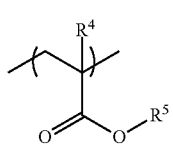

General Formula (2)

In General Formulae (1) and (2), each of $R^1$ and $R^4$ independently represents a hydrogen atom or a methyl group. Each of $R^2$ and $R^3$ independently represents a hydrogen atom, a methyl group, or an ethyl group. $R^5$ represents a straight chain, branched, or cyclic unsubstituted alkyl group having 2 to 8 carbon atoms, a substituted alkyl group that may have an aromatic ring or a polycyclic ring as a substituent, and a substituent expressed by General Formula (3) below.

Examples of the substituent that can be introduced to the substituted alkyl group include an aromatic ring group, a polycyclic group, and a polyether group.

$$\text{-(-L-O-)}_n R^6 \qquad \text{General Formula (3)}$$

In General Formula (3), L represents an alkylene group having 2 to 6 carbon atoms, and $R^6$ represents a straight chain, branched, or cyclic unsubstituted alkyl group or a straight chain, branched, or cyclic aromatic substituted alkyl group having 4 to 8 carbon atoms. n is an average addition molar number of polyether and represents a number of 2 to 4.

Both $R^2$ and $R^3$ of the repeating unit expressed by General Formula (1) are preferably hydrogen atoms. $R^5$ of the repeating unit expressed by General Formula (2) is a straight chain, branched, or cyclic unsubstituted alkyl group having 2 to 8 carbon atoms.

As the combination of the repeating unit expressed by each of General Formulae (1) and (2), it is particularly preferably that both $R^1$ and $R^4$ of General Formulae (1) and (2) are hydrogen atoms, both $R^2$ and $R^3$ of General Formula (1) are hydrogen atoms, and $R^5$ of General Formula (2) is a branched and unsubstituted alkyl group having 4 carbon atoms.

The specific hydrophilic polymer (e) is preferably a hydrophilic polymer having a repeating unit expressed by General Formula (4) below.

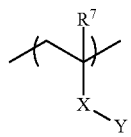

General Formula (4)

In General Formula (4), le represents a hydrogen atom or a methyl group. X represents a single bond, a bivalent linking group selected from the structure expressed by Structural Group (5) below, or a bivalent linking group obtained by combining plural products selected from the structure expressed by Structural Group (5) below. Y represents a carboxylic acid group, a carboxylic acid salt group, a sulfonic acid group, a sulfonic acid salt group, a phosphoric acid group, a phosphoric acid salt group, a phosphonic acid group, a phosphonic acid salt group, a hydroxyl group, a carboxy betaine group, a sulfobetaine group, an ammonium group, or a polyether group expressed by General Formula (6) below.

As the repeating unit expressed by General Formula (4), in view of the water-solubility and the on-press developability, Y is preferably a sulfonic acid group, a sulfonic acid salt group, a carboxy betaine group, a sulfobetaine group, and an ammonium group, and more preferably a sulfonic acid group, a sulfonic acid salt group, and a sulfobetaine group.

In addition, X is preferably a bivalent linking chain combining the structure indicated by the linking chain in Structural Group (5) below.

Structural Group (5)

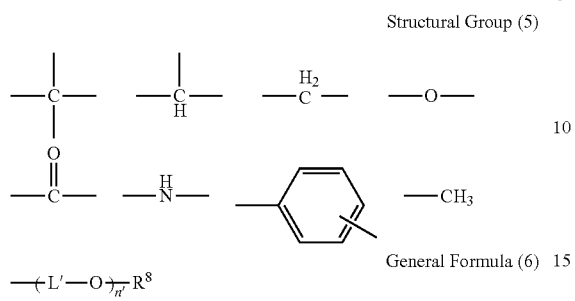

General Formula (6)

In General Formula (6), L' represents an alkylene group having 2 to 3 carbon atoms and $R^8$ represents a hydrogen atom or a methyl group. n' is an average addition molar number of polyether and is a number of 2 to 4.

Specific examples of a monomer derived from the repeating unit expressed by General Formula (1) include acrylamide, methacrylamide, N-methyl acrylamide, N-methyl methacrylamide, N-ethyl acrylamide, N-ethyl methacrylamide, N,N-dimethyl acrylamide, N,N-dimethyl-methacrylamide, N,N-diethyl acrylamide, N,N-diethyl methacrylamide, N,N-ethyl-methyl acrylamide, and N,N-ethyl methyl methacrylamide.

Specific examples of the monomer derived from the repeating unit expressed by General Formula (2) include methyl acrylate, ethyl acrylate, propyl acrylate, isopropyl acrylate, n-butyl acrylate, i-butyl acrylate, t-butyl acrylate, pentyl acrylate, hexyl acrylate, cyclohexyl acrylate, heptyl acrylate, octyl acrylate, 2-ethylhexyl acrylate, nonyl acrylate, decyl acrylate, 2-(2-ethylhexyloxyethoxy) ethyl acrylate, methyl methacrylate, ethyl methacrylate, propyl methacrylate, isopropyl methacrylate, n-butyl methacrylate, i-butyl methacrylate, t-butyl methacrylate, pentyl methacrylate, hexyl methacrylate, cyclohexyl methacrylate, heptyl methacrylate, octyl methacrylate, 2-ethylhexyl methacrylate, nonyl methacrylate, and decyl methacrylate.

The content of the repeating unit expressed by General Formula (1) is preferably 65% by mol to 96.7% by mol, more preferably 70% by mol to 80% by mol, and still more preferably 74% by mol to 80% by mol. The content of the repeating unit expressed by General Formula (2) is preferably 3% by mol to 30% by mol, more preferably 20% by mol to 30% by mol, and still more preferably 20% by mol to 26% by mol.

Specific examples of the monomer derived from the repeating unit expressed by General Formula (4) include a 2-acryloyl amino-2-methyl-propanesulfonic acid, sodium 2-acryloylamino-2-methyl-propanesulfonate, a 2-acryloyl-amino-2-methyl-potassium propane sulfonic acid, 4-((3-methacrylamidepropyl)dimethylammonio)butan-1-sulfonate, a 4-((3-acrylamidopropyl)dimethylammonio)butan-1-sulfonate, vinyl alcohol, acrylic acid, a methacrylic acid, sodium styrene sulfonate, diethylene glycol monomethyl ether methacrylate, hydroxyethyl acrylate, hydroxyethyl methacrylate, methacrylic choline chloride, 3-sulfopropyl methacrylate potassium, 2-(methacryloyloxy)ethyl phosphate, dimethyl-N-methacryloyloxyethyl-N-carboxymethyl-ammonium betaine, and a vinyl phosphonic acid.

The specific hydrophilic polymer (e) contains the repeating unit expressed by General Formula (4) preferably in the range of 0.3% by mol to 5% by mol, more preferably in the range of 0.3% by mol to 3% by mol, and particularly preferably in the range of 0.3% by mol to 1.5% by mol.

If the specific hydrophilic polymer (e) contains the repeating unit expressed by General Formula (4) in the preferred range above, the favorable on-press developability, the depositing properties, and the printing durability can be obtained.

The weight average molecular weight (Mw) calculated by polystyrene in a GPC method of the specific hydrophilic polymer (e) is preferably 10,000 to 200,000, more preferably 10,000 to 100,000, and particularly preferably 10,000 to 30,000.

Hereinafter, specific examples of the specific hydrophilic polymer (e) are indicated. The ratio of each repeating unit is described by a mole fraction, and all of the Mw of the hydrophilic polymer are 20,000.

The content of the specific hydrophilic polymer (e) in the protection layer is preferably 40% by mass or more, more preferably 60% by mass or more, and particularly preferably 80% by mass or more with respect to the solid content of the protection layer. In this range, it is possible to provide the lithographic printing plate having more favorable depositing properties and higher printing durability, and it is possible to obtain a lithographic printing plate precursor having excellent on-press developability.

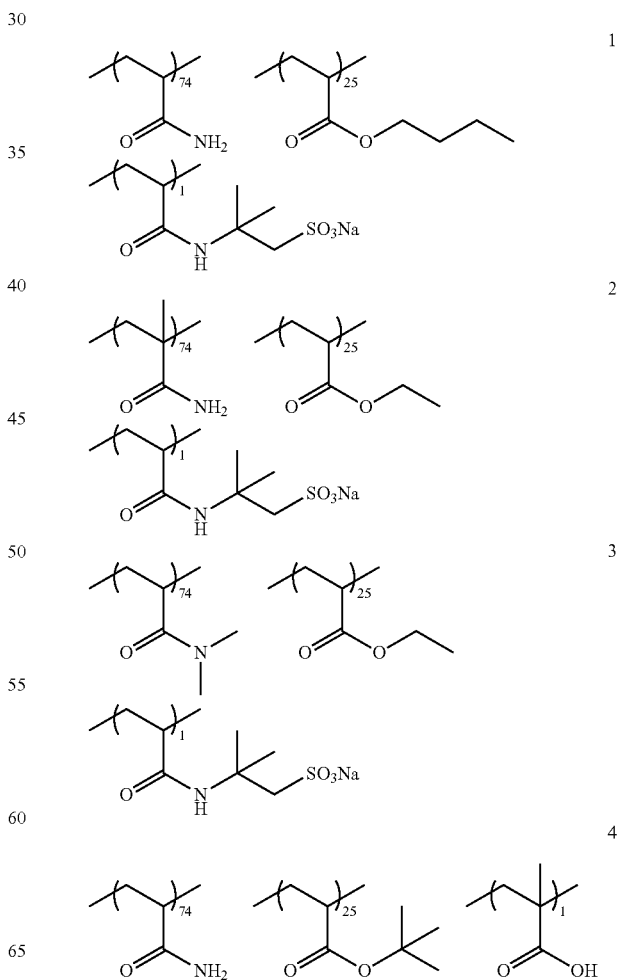

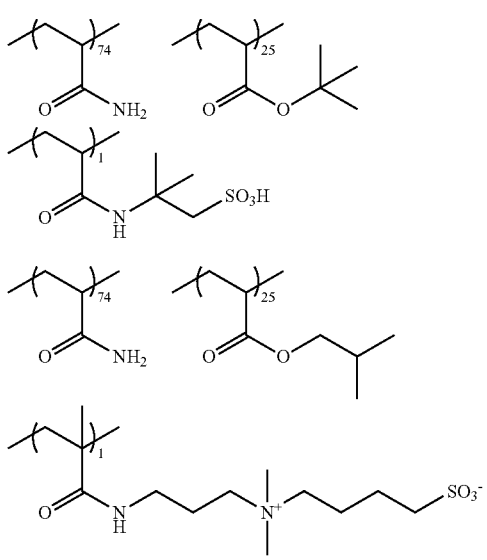

In order to improve oxygen barrier properties, the protection layer preferably contains an inorganic layer-shaped compound such as natural mica and synthetic mica as disclosed in JP2005-119273A.

The protection layer may contain well-known additives such as a plasticizer for providing flexibility, a surfactant for improving coating properties, inorganic fine particles for controlling sliding properties of a surface, and an ultraviolet absorber. In addition, a sensitizing agent described in the section of the image recording layer can be contained in the protection layer.

Adhesion properties with the image recording layer or the scratch resistance are also extremely important for dealing with the lithographic printing plate precursor. That is, if the hydrophilic protection layer having the water-soluble polymer as a main component is stacked on the lipophilic image recording layer, film separation caused by adhesion insufficiency is easily generated, and a separated portion generates defects such as poor film curing due to polymerization inhibition of oxygen. Various kinds of suggestions have been made such that adhesion properties between two layers are improved. For example, in JP1979-12215B (JP-S54-12215B) and GB1303578A, in the protection layer, it is disclosed that sufficient adhesion properties can be obtained by mixing an acrylic emulsion or a water-insoluble vinylpyrrolidone-vinyl acetate copolymer in the range of 20% by mass to 60% by mass. With respect to the protection layer in the invention, all of these well-known techniques can be applied.

The protection layer is coated by a well-known method, for example, disclosed in U.S. Pat. No. 3,458,311A and JP1980-49729A (JP-S55-49729A). The coating amount of the protection layer is preferably 0.01 g/m² to 10 g/m², more preferably 0.02 g/m² to 3 g/m², and particularly preferably 0.02 g/m² to 1 g/m² in terms of the coating amount after drying.

EXAMPLES

Hereinafter, the invention is described in detail with reference to examples, but the invention is not limited thereto. In addition, in the polymer compound, unless particularly regulated otherwise, the molecular weight is a mass average molar mass (Mw), and the ratio of the repeating unit is a mole percentage.

Examples 1 to 12 and Comparative Examples 1 to 8

Manufacturing of Lithographic Printing Plate Precursors (1) and (2)

(1) Manufacturing of Support

In order to remove rolling oil on the surface of an aluminum support (material: JIS A 1050) having a thickness of 0.3 mm, a degreasing process was performed for 30 seconds at 50° C. by using 10% by mass of a sodium aluminate aqueous solution, a surface of aluminum support was grained by using three bundle-implanted nylon brushes having a brush diameter of 0.3 mm and a pumice-aqueous suspension liquid (specific gravity: 1.1 g/cm³) having a median diameter of 25 μm, and the aluminum support was washed with water. This sheet was immersed for 9 seconds in 25% by mass of the sodium hydroxide aqueous solution at 45° C., etched, washed with water, further immersed for 20 seconds in 20% by mass of the nitric acid aqueous solution at 60° C., and washed with water. At this point, the etching amount of the grained surface was about 3 g/m².

Subsequently, an electrochemical roughening process was continuously performed by using 60 Hz of the alternating current voltage. The electrolyte at this point was 1% by mass of a nitric acid aqueous solution (including 0.5% by mass of aluminum ion), and a liquid temperature was 50° C. By using a trapezoidal rectangular wave alternating current having an alternating current power waveform in which a time TP until a current value reached the peak from zero was 0.8 msec, and a duty ratio was 1:1, an electrochemical roughening process was performed with a carbon electrode as an opposite pole. A ferrite was used as an auxiliary anode. A current density was 30 A/dm² in terms of a peak value of an electric current, and 5% of the electric current flowing from the power source in the auxiliary anode was distributed. The electricity amount in the nitric acid electrolysis was 175 C/dm² which was the electricity amount when the aluminum support was an anode. Thereafter, washing with water by spraying was performed.

Subsequently, with the electrolyte of 0.5% by mass of a hydrochloric acid aqueous solution (including 0.5% by mass of aluminum ion) at the liquid temperature of 50° C., in the condition in which the electricity amount was 50 C/dm² when the aluminum support was an anode, in the same manner as in the nitric acid electrolysis, an electrochemical roughening process was performed, and thereafter washing with water by spraying was performed.

Subsequently, with 15% by mass of a sulfuric acid aqueous solution (including 0.5% by mass of aluminum ion) as the electrolyte, in an electric current density of 15 A/dm², direct current anodic oxidation coating of 2.5 g/m² was provided in the aluminum support, and then the aluminum support was washed with water and dried to manufacture a support (1).

Thereafter, in order to secure hydrophilicity of the non-image portion, a silicate process was performed on the support (1) for 10 seconds at 60° C. by using 2.5% by mass of aqueous solution of sodium silicate No. 3, and then washing with water was performed so as to obtain a support (2). The deposition amount of Si was 10 mg/m². The center line average roughness (Ra) of the support (2) was measured by using a needle having a diameter of 2 µm, and was 0.51 µm.

(2) Forming of Intermediate Layer

Subsequently, the support (2) was coated with an intermediate layer coating liquid (1) in a composition described below, such that the dried coating amount became 20 mg/m², and a support having an intermediate layer was manufactured.

| <Intermediate layer coating liquid (1)> | |
|---|---|
| Polymer compound for intermediate layer [Structure described below] | 0.50 g |
| N-(2-hydroxyethyl) iminodiacetic acid | 0.025 g |
| Water | 500.00 g |

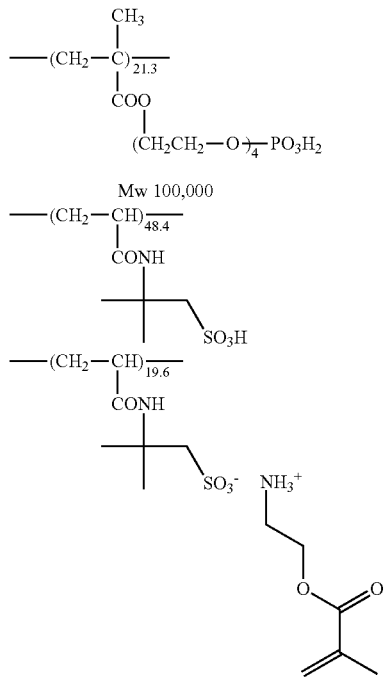

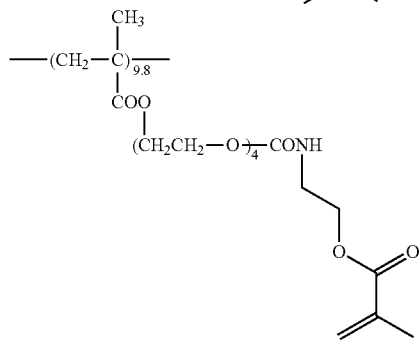

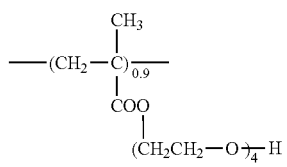

(3) Forming of Image Recording Layer

The intermediate layer formed as described above was bar-coated with the image recording layer coating liquid (1) in the composition described below, and then oven-dried for 60 seconds at 100° C., and an image recording layer having the drying coating amount of 1.0 g/m² was formed.

The image recording layer coating liquid (1) was obtained by mixing and stirring a photosensitive liquid (1) and a microgel liquid (1) described below right before coating.

| <Photosensitive liquid (1)> | |
|---|---|
| Binder polymer (1) [Structure described below] | 0.240 g |
| Infrared absorber (1) [Structure described below] | 0.030 g |
| Polymerization initiator (1) [Structure described below] | 0.162 g |
| Polymerizable compound tris(acryloyloxyethyl)isocyanurate (NK ester A-9300, manufactured by Shin-Nakamura Chemical Co., Ltd.) | 0.192 g |
| Low molecular hydrophilic compound tris(2-hydroxyethyl)isocyanurate | 0.062 g |
| Low molecular hydrophilic compound (1) [Structure described below] | 0.050 g |
| Borate salt (1) [Structure described below] | 0.14 g |
| Sensitizing agent phosphonium compound (1) [Structure described below] | 0.055 g |
| Sensitizing agent: Benzyl-dimethyl-octylammonium•PF₆ salt | 0.018 g |
| Sensitizing agent: ammonium group-containing polymer [Structure described below, reduced specific viscosity: 44 cSt/g/ml] | 0.035 g |
| Fluorine-based surfactant (1) [Structure described below] | 0.008 g |
| 2-Butanone | 1.091 g |
| 1-Methoxy-2-propanol | 8.609 g |

| <Microgel liquid (1)> | |
|---|---|
| Microgel (1) [described below] | 2.640 g |
| Distilled water | 2.425 g |

Structures of the binder polymer (1), the infrared absorber (1), the polymerization initiator (1), the low molecular hydrophilic compound (1), the borate salt (1), the phosphonium compound (1), the ammonium group-containing polymer, and the fluorine-based surfactant (1) above are described below.

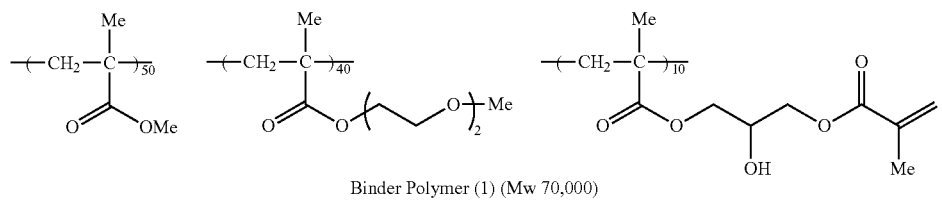
Binder Polymer (1) (Mw 70,000)
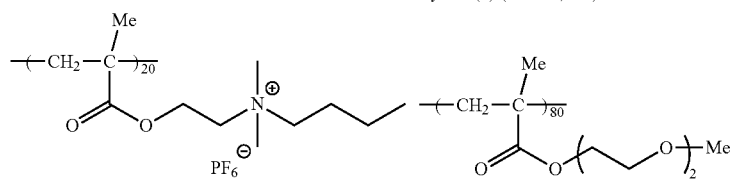
Ammonium group-containing polymer
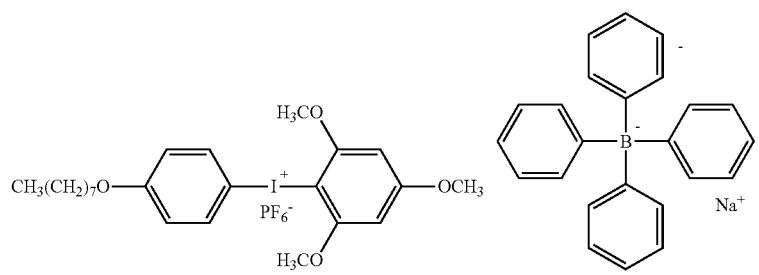
Polymerization Initiator (1)　　　　Borate Salt (1)
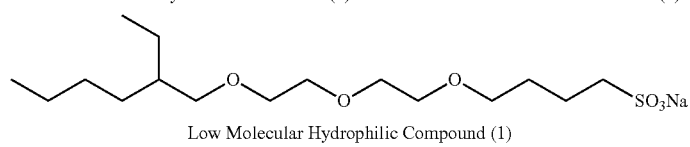
Low Molecular Hydrophilic Compound (1)
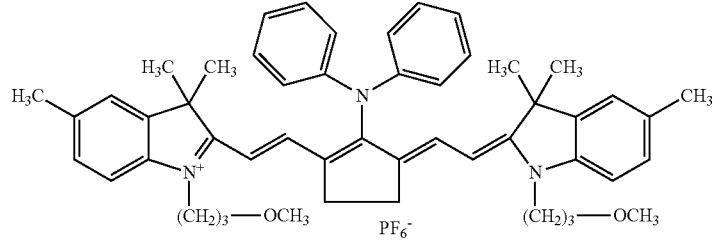
Infrared absorber (1)
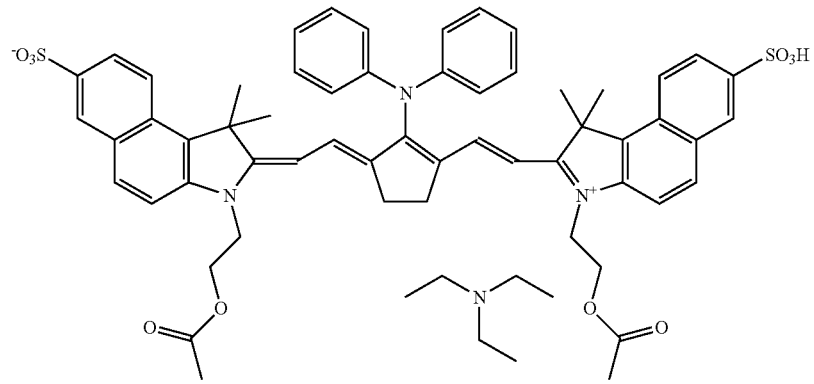
Infrared absorber (2)
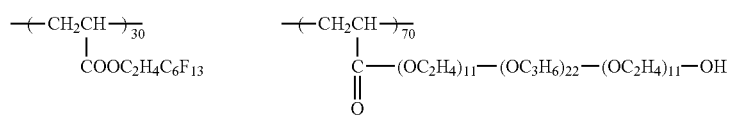
Fluorine-based surfactant (1) (Mw 13,000)

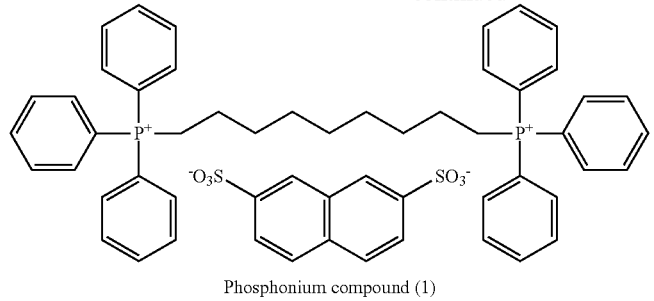

Phosphonium compound (1)

(Manufacturing of Microgel (1))

As an oil phase component, 4.46 g of multifunctional isocyanate in the structures described below (manufactured by Mitsui Chemicals, Inc.; 75% by mass of ethyl acetate solution), trimethylolpropane (6 mols), and xylene diisocyanate (18 mols) were added, 10 g of an adduct (manufactured by Mitsui Chemicals, Inc.; 50% by mass ethyl acetate solution) obtained by further adding methyl one-terminal polyoxyethylene (1 mol, and the number of repetitions of the oxyethylene unit was 90) thereto, 3.15 g of pentaerythritol triacrylate (manufactured by Nippon Kayaku Co., Ltd., SR444), and 0.1 g of Pionin A-41C (manufactured by Takemoto Oil & Fat Co., Ltd.) were dissolved in 17 g of ethyl acetate. As a water phase component, 40 g of a 4% by mass aqueous solution of polyvinyl alcohol (manufactured by Kuraray Co., Ltd., PVA-205) was manufactured. The oil phase component and the water phase component were mixed and emulsified for 10 minutes at 12,000 rpm by using a homogenizer. The obtained emulsion was added to 25 g of distilled water, stirred for 30 minutes at room temperature, and stirred for 3 hours at 50° C. In this manner, the resultant was diluted with distilled water such that the solid content concentration of the obtained microgel liquid became 15% by mass, to obtain the microgel (1). The average particle diameter of the microgel was measured by a light scattering method, such that the average particle diameter was 0.2 μm.

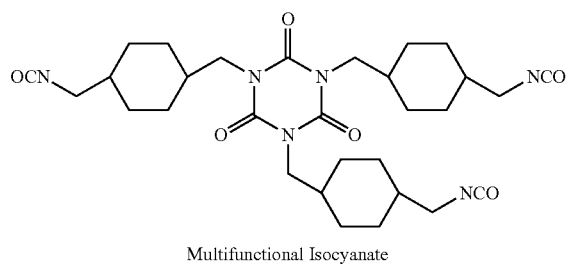

Multifunctional Isocyanate (4) Forming of Overcoat Layer

The image recording layer was bar-coated with the overcoat layer coating liquid (1) or (2) in the compositions described below and oven-dried for 60 seconds at 120° C., to form an overcoat layer with the drying coating amount of 0.15 g/m², such that the lithographic printing plate precursors (1) and (2) were manufactured.

<Overcoat layer coating liquid (1)>

| | |
|---|---|
| Inorganic layer-shaped compound dispersing liquid (1) | 1.5 g |
| 6% by mass of aqueous solution of polyvinyl alcohol (manufactured by The Nippon Synthetic Chemical Industry Co., Ltd., CKS50, Sulfonic acid-modified, Degree of saponification: 99% by mol or greater, Polymerization degree: 300) | 0.55 g |

<Overcoat layer coating liquid (1)>

| | |
|---|---|
| 6% by mass of aqueous solution of polyvinyl alcohol (manufactured by Kuraray Co., Ltd., PVA-405, Degree of saponification: 81.5% by mol, Polymerization degree: 500) | 0.03 g |
| Surfactant (manufactured by Nihon Emulsion Co., Ltd., EMALEX 710) 1% by mass aqueous solution | 0.86 g |
| Ion exchanged water | 6.0 g |

(Manufacturing of Inorganic Layer-Shaped Compound Dispersing Liquid (1))

6.4 g of a synthetic mica SOMASHIF ME-100 (manufactured by Co-Op Chemical Co., Ltd.) was added to 193.6 g of ion exchanged water, and was dispersed by using a homogenizer until an average particle diameter (laser dispersion method) became 3 μm. The aspect ratio of the obtained dispersion particles was 100 or greater.

<Overcoat layer coating liquid (2)>

| | |
|---|---|
| 6% by mass of aqueous solution of polyvinyl alcohol (manufactured by The Nippon Synthetic Chemical Industry Co., Ltd., CKS50, sulfonic acid-modified, Degree of saponification: 99% by mol or greater, and polymerization degree: 300) | 0.55 g |
| 6% by mass of aqueous solution of Polyvinyl alcohol (manufactured by Kuraray Co., Ltd., PVA-405, Degree of saponification: 81.5% by mol, polymerization degree: 500) | 0.03 g |
| Surfactant (manufactured by Nihon Emulsion Co., Ltd., EMALEX 710) 1% by mass of aqueous solution | 0.86 g |
| Hydroxypropyl cellulose (manufactured by Nippon Soda Co., Ltd., HPC-L) 3% by mass aqueous solution | 1.5 g |
| Ion exchanged water | 6.0 g |

[Manufacturing of Lithographic Printing Plate Precursor (3)]

(1) Manufacturing of Support

In order to secure hydrophilicity of the non-image portion, a process was performed on the support (1) for 10 seconds at 45° C., by using a 1% by mass of a polyacrylic acid aqueous solution, to obtain the support (3).

(2) Forming of Image Recording Layer

The support (3) was bar-coated with the image recording layer coating liquid (2) in the composition described below and oven-dried for 60 seconds at 100° C., to form an image recording layer with a drying coating amount of 1.0 g/m², such that a lithographic printing plate precursor (3) was obtained.

<Image recording layer coating liquid (2)>

| | |
|---|---|
| Polymer fine particle water dispersion liquid (1) [described below] | 20.0 g |
| Infrared absorber (2) [Structure described below] | 0.2 g |
| Polymerization initiator (2) [Structure described below] | 0.5 g |

-continued

<Image recording layer coating liquid (2)>

| | |
|---|---|
| Borate salt (1) [Structure described above] | 0.45 g |
| Polymerizable compound SR-399 (manufactured by Sartomer Company, Inc.) | 1.50 g |
| Chain transfer agent: Mercapto-3-triazol | 0.2 g |
| Surfactant Byk336 (manufactured by BYK-Chemie GmbH) | 0.4 g |
| Klucel M (manufactured by Hercules, Inc.) | 4.8 g |
| ELVACITE 4026 (manufactured by INEOS Capital Limited) | 2.5 g |
| N-propanol | 55.0 g |
| 2-Butanone | 17.0 g |

The structure of the polymerization initiator (2) above is described.

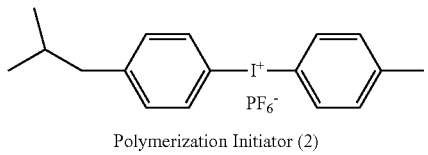

Polymerization Initiator (2)

The compounds in the compositions above which are described by the product names are as described below.

SR-399: Dipentaerythritol pentaacrylate

Byk 336: Modified dimethylpolysiloxane copolymer (25% by mass xylene/methoxypropyl acetate solution)

Klucel M: hydroxypropyl cellulose (2% by mass aqueous solution)

ELVACITE 4026: high branched polymethyl methacrylate (10% by mass of 2-butanone solution)

(Preparing of Polymer fine particle water dispersion liquid (1))

A stirrer, a thermometer, a drop rod, a nitrogen introducing pipe, and a reflux cooler were provided in a 1,000-ml 4-necked flask, 10 g of polyethylene glycol methyl ether methacrylate (PEGMA, an average repeating unit of an ethylene glycol was 50), 200 g of distilled water, and 200 g of n-propanol were added while deoxidation was performed by introducing nitrogen gas, and heating was performed until the internal temperature became 70° C. Subsequently, a mixture of 10 g of styrene (St) which was mixed in advance, 80 g of acrylonitrile (AN), and 0.8 g of 2,2'-azobisisobutyronitrile were dripped over 1 hour. After the completion of the dripping, a reaction was continued for 5 hours without change, 0.4 g of 2,2'-azobisisobutyronitrile was added, and an internal temperature was increased to 80° C. Subsequently, 0.5 g of 2,2'-azobisisobutyronitrile was added over 6 hours. When the reaction was performed for 20 hours in total, polymerization was performed by 98% or more, the polymer fine particle water dispersion liquid (1) in which PEGMA/St/AN=10/10/80 in a mass ratio was obtained. The particle diameter distribution of the polymer fine particle was the maximum in the particle diameter of 150 nm.

The particle distribution was obtained by photographing an electron micrograph photograph of the polymer fine particle, measuring particle diameters of 5,000 fine particles in the photograph in total, obtained measurement values of the particle diameters from the maximum to 0 were divided into 50 with a logarithmic scale, and plotting appearance frequencies of respective particle diameters. In addition, with respect to a non-spherical particle, a particle diameter value of a spherical particle having the same particle area to the particle area in the photograph was set to a particle diameter thereof.

[Exposure and Process of Lithographic Printing Plate Precursor]

The lithographic printing plate precursors (1), (2), and (3) were exposed under the conditions of an output of 9 W, the number of revolutions of an external surface of a drum of 210 rpm, and a resolution of 2400 dpi with Trendsetter 3244VX manufactured by CREO Co., Ltd. to which a water cooling-type 40 W infrared semiconductor laser was mounted. In the exposure image, a halftone dot image of 240 lpi from 2% to 95% and a solid portion (100% halftone dot image) were included.

The lithographic printing plate precursor after the exposure was processed by using respective processing liquids presented in Table 2 below. That is, the unexposed region of the image recording layer was removed and at the same time the exposure portion was colored by rubbing a plate surface of the lithographic printing plate precursor for about 20 seconds by hand using an urethane sponge surface of a supercleaner manufactured by Sunfabless Co., Ltd. to which the processing liquids were attached. Subsequently, the plate surface was washed with water using a shower tap and naturally dried to obtain the lithographic printing plate.

[Table 2]

TABLE 2

| | Basic dye (Content (g)) | Anionic surfactant (Content (g)) | Benzyl alcohol (g) | Pure water (g) |
|---|---|---|---|---|
| Processing Liquid 1 | D-1 (2.0) | A (60.2) | 17.0 | 920.8 |
| Processing Liquid 2 | D-2 (2.0) | B (90.7) | 17.0 | 890.3 |
| Processing Liquid 3 | D-5 (2.0) | C (99.3) | 17.0 | 881.7 |
| Processing Liquid 4 | D-7 (2.0) | A (146.2) | 17.0 | 834.8 |
| Processing Liquid 5 | D-13 (2.0) | A (35.0) | 17.0 | 922.7 |
| Processing Liquid 6 | Victoria Pure Blue BOH conc (2.0) | B (90.0) | 17.0 | 891.0 |
| Processing Liquid 7 | Brilliant Blue R (2.0) | B (55.9) | 17.0 | 925.1 |
| Processing Liquid 8 | Methylene Blue (2.0) | B (216.5) | 17.0 | 764.5 |
| Processing Liquid 9 | D-2 (2.0) | D (116.4) | 17.0 | 864.6 |

The anionic surfactant used in the processing liquid were as described below.

Anionic surfactant A: PELEX NBL (Sodium alkyl naphthalene sulfonic acid) (manufactured by Kao Corporation) (35% aqueous solution)

Anionic surfactant B: ELEMINOL MON2 (mixture of alkyl diphenyl sodium disulfonate and alkyl diphenyl ether sodium monosulfonate) (manufactured by Sanyo Chemical Industries, Ltd.) (47% aqueous solution)

Anionic surfactant C: NEWCOL B4-SN (polyoxyethylene aryl ether sulfuric acid ester salt) (manufactured by Nippon Nyukazai Co, Ltd.) (60% aqueous solution)

Anionic surfactant D: RAPISOL A-30 (di-2-ethylhexyl-sodium sulfosuccinate) (manufactured by NOF Corporation) (30% aqueous solution)

[Evaluation]

With respect to the lithographic printing plate after the processes, image contrast, image portion dye unevenness, attachment of a development scum, and a 50% halftone dot area ratio of 240 lpi were evaluated as below. The results are presented in Tables 3 and 4 as below.

(Image Contrast)

The concentrations of the image portion and the non-image portion of the lithographic printing plate were measured by using a portable reflection concentration meter RD-19 manufactured by GretagMacbeth GmbH, and the difference thereof was obtained and evaluated as an image contrast. As the numerical value was greater, a concentration difference between the image portion and the non-image portion become great, and accordingly the plate inspection of the lithographic printing plate was able to be more easily performed.

(Image Portion Dye Unevenness)

Dye unevenness of the image portion was evaluated with the criteria below.

A: Dye unevenness was not confirmed at all.
B: Dye unevenness was slightly confirmed.
C: Dye unevenness was clearly confirmed.

(Attachment of Development Scum)

Whether a scum of the removed unexposed region is attached to the surface of the lithographic printing plate was visually observed.

(50% halftone dot area ratio of 240 lpi)

Halftone dots of the lithographic printing plate were measured by using iC Plate II manufactured by GretagMacbeth GmbH, and a 50% halftone dot area ratio (%) of 240 lpi was obtained.

the basic coloring dye expressed by General Formula (I) according to the invention was used, an image contrast was low, and the image portion dye unevenness was confirmed. In addition, in Comparative Example 1, an ununiform image was formed, a measurement value of the 50% halftone dot area ratio in 240 lpi was greatly uneven, and thus the measurement value was not able to be specified. Further, in Comparative Examples 2 and 3, since the concentration difference between the image portion and the non-image portion was small, the detection of the image was not sufficient, such that the 50% halftone dot area ratio in 240 lpi was not able to be measured. Accordingly, the plate inspection of the on-press development-type lithographic printing plate precursor or the image quality control were not able to be sufficiently performed, and particularly the plate inspection of the on-press development-type lithographic printing plate precursor or the image quality control, including a high definition image was substantially impossible. In addition, in Comparative Example 4 in which the processing liquid including an anionic surfactant other than the anionic surfactant having the aromatic ring according to the invention

TABLE 3

| | Processing liquid | Lithographic printing plate precursor | Image contrast | Image portion dye unevenness | Attachment of development scum | 50% Halftone dot area ratio of 240 lpi (%) |
|---|---|---|---|---|---|---|
| Example 1 | 1 | (1) | 0.59 | A | None | 52 |
| Example 2 | 2 | (1) | 0.58 | A | None | 52 |
| Example 3 | 2 | (2) | 0.57 | A | None | 53 |
| Example 4 | 3 | (1) | 0.58 | A | None | 52 |
| Example 5 | 4 | (1) | 0.58 | A | None | 52 |
| Example 6 | 5 | (1) | 0.58 | A | None | 52 |
| Example 7 | 5 | (2) | 0.58 | A | None | 52 |
| Comparative Example 1 | 6 | (1) | 0.45 | B | None | Unevenness of measurement value was great |
| Comparative Example 2 | 7 | (1) | 0.18 | B | None | Unmeasurable |
| Comparative Example 3 | 8 | (1) | 0.35 | B | None | Unmeasurable |
| Comparative Example 4 | 9 | (1) | 0.41 | C | Existence | Unmeasurable |

From the results presented in Table 3, it was found that if the processing liquid according to the invention is used, it was possible to obtain a colored image in which an image contrast was high, image portion dye unevenness was not confirmed at all, a development scum was not attached, and a 50% halftone dot area ratio of 240 lpi was easily measured. As a result, if the processing liquid according to the invention was used, particularly it is possible to easily perform a plate inspection of the on-press development-type lithographic printing plate precursor or image quality control, including a high definition image.

In contrast, in Comparative Examples 1 to 3, in which the processing liquid including the basic coloring dye other than was used, image contrast was low, and image portion dye unevenness was clearly confirmed. In addition, since the concentration difference between the image portion and the non-image portion is small, the detection of the image was not sufficient, and the 50% halftone dot area ratio in 240 lpi was not able to be measured. Further, it was recognized that a development scum was attached on the surface of the lithographic printing plate.

As above, it was found that the combination of the processing liquid according to the invention with the anionic surfactant having the aromatic ring and the basic coloring dye expressed by General Formula (I) according to the invention exhibits the highly prominent effect.

TABLE 4

| | Processing liquid | Lithographic printing plate precursor | Image contrast | Image portion dye unevenness | Attachment of development scum | 50% Halftone dot area ratio of 240 lpi (%) |
|---|---|---|---|---|---|---|
| Example 8 | 1 | (3) | 0.55 | A | None | 54 |
| Example 9 | 2 | (3) | 0.53 | A | None | 54 |
| Example 10 | 3 | (3) | 0.55 | A | None | 54 |
| Example 11 | 4 | (3) | 0.52 | A | None | 54 |
| Example 12 | 5 | (3) | 0.54 | A | None | 54 |

TABLE 4-continued

| | Processing liquid | Lithographic printing plate precursor | Image contrast | Image portion dye unevenness | Attachment of development scum | 50% Halftone dot area ratio of 240 lpi (%) |
|---|---|---|---|---|---|---|
| Comparative Example 5 | 6 | (3) | 0.39 | B | None | Unevenness of measurement value was great |
| Comparative Example 6 | 7 | (3) | 0.11 | B | None | Unmeasurable |
| Comparative Example 7 | 8 | (3) | 0.31 | B | None | Unmeasurable |
| Comparative Example 8 | 9 | (3) | 0.36 | C | Existence | Unmeasurable |

From the results presented in Table 4, it was found that, when the constitution of the lithographic printing plate precursor was changed, the same results as presented in Table 3 were able to be obtained.

INDUSTRIAL APPLICABILITY

According to the invention, it is possible to obtain the processing liquid and the processing method that can favorably perform the plate inspection of the on-press development-type lithographic printing plate precursor and the image quality control. In addition, it is possible to obtain the processing liquid and the processing method that can easily perform the plate inspection of the high definition image and the image quality control in the on-press development-type lithographic printing plate precursor.

The invention is described in detail with reference to the specific embodiments, but it is clear to a person having ordinary skill in the art that various changes and modifications can be added without departing from the spirit and the scope of the invention.

This application is based on Japanese patent application (JP2013-115469) filed on May 31, 2013, and the entire contents thereof are incorporated herein by reference.

What is claimed is:

1. A processing liquid for a lithographic printing plate precursor having an image recording layer formable of an image by removing an unexposed region with at least one of printing ink and dampening water, the processing liquid comprising:
a basic coloring dye expressed by General Formula (I) below; and
an anionic surfactant having an aromatic ring:

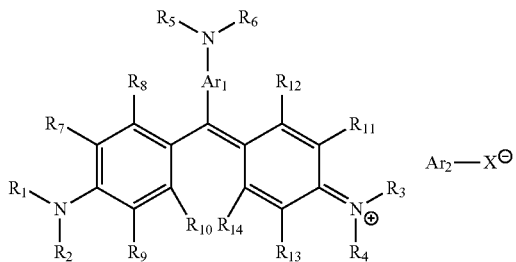

General Formula (I)

wherein in General Formula (I),
each of $R_1$ to $R_{14}$ independently represents a hydrogen atom and an alkyl group having 1 to 4 carbon atoms, $R_{10}$ and $R_{14}$ may be bonded to each other to form a single bond,
$Ar_1$ represents a phenylene group or a naphthylene group,
$Ar_2$ represents an aryl group, and
$X^-$ represents $SO_3^-$ or $COO^-$.

2. The processing liquid for a lithographic printing plate precursor according to claim 1,
wherein the aryl group represented by $Ar_2$ in General Formula (I) is a phenyl group or a naphthyl group.

3. The processing liquid for a lithographic printing plate precursor according to claim 1,
wherein $X^-$ in General Formula (I) above is $SO_3^-$.

4. The processing liquid for a lithographic printing plate precursor according to claim 1,
wherein the anionic surfactant having the aromatic ring is an anionic surfactant having a naphthalene skeleton or a diphenyl ether skeleton.

5. The processing liquid for a lithographic printing plate precursor according to claim 1,
wherein the content of the basic coloring dye expressed by General Formula (I) above is 0.001% by mass to 5% by mass.

6. The processing liquid for a lithographic printing plate precursor according to claim 1,
wherein a content of the anionic surfactant having the aromatic ring is 0.1% by mass to 20% by mass.

7. A processing method for a lithographic printing plate precursor comprising:
processing an image-exposed lithographic printing plate precursor by using the processing liquid for a lithographic printing plate precursor according to claim 1.

8. The processing method for a lithographic printing plate precursor according to claim 7,
wherein the lithographic print plate precursor has an image recording layer formable of an image by removing an unexposed region with at least one of printing ink and dampening water, and
the image recording layer of the lithographic printing plate precursor contains an infrared absorber, a polymerization initiator, a polymerizable compound, and a binder polymer.

9. The processing method for a lithographic printing plate precursor according to claim 8,
wherein the binder polymer is a binder polymer having a polyoxyalkylene structure in a side chain.

* * * * *